(12) United States Patent
Fell et al.

(10) Patent No.: US 11,662,361 B2
(45) Date of Patent: May 30, 2023

(54) METHODS FOR CLOSED LOOP OPERATION OF CAPACITIVE ACCELEROMETERS

(71) Applicant: Atlantic Inertial Systems Limited, Plymouth (GB)

(72) Inventors: Christopher Paul Fell, Cheltenham (GB); Alan Malvern, Plymouth (GB)

(73) Assignee: ATLANTIC INERTIAL SYSTEMS LIMITED, Plymouth (GB)

( * ) Notice: Subject to any disclaimer, the term of this patent is extended or adjusted under 35 U.S.C. 154(b) by 90 days.

(21) Appl. No.: 17/168,698

(22) Filed: Feb. 5, 2021

(65) Prior Publication Data

US 2021/0247417 A1    Aug. 12, 2021

(30) Foreign Application Priority Data

Feb. 7, 2020   (EP) .................................... 20275030

(51) Int. Cl.
*G01P 15/125* (2006.01)
*G01D 3/06* (2006.01)
(Continued)

(52) U.S. Cl.
CPC ...... *G01P 15/125* (2013.01); *B81B 2201/033* (2013.01); *G01D 3/066* (2013.01); *G01L 1/144* (2013.01); *G01P 21/00* (2013.01)

(58) Field of Classification Search
None
See application file for complete search history.

(56) References Cited

U.S. PATENT DOCUMENTS 6,631,643 B2   10/2003   Malvern et al.
6,761,069 B2   7/2004    Hollocher et al.
(Continued)

FOREIGN PATENT DOCUMENTS

EP   0338688 A1   10/1989
JP   2000028394 A   1/2000
(Continued)

OTHER PUBLICATIONS

Extended European Search Report for International Application No. 20275030.3 dated Jul. 20, 2020, 8 pages.

*Primary Examiner* — Raul J Rios Russo
*Assistant Examiner* — Carl F. R. Tchatchouang
(74) *Attorney, Agent, or Firm* — Cantor Colburn LLP

(57) ABSTRACT

A capacitive accelerometer includes a proof mass, first and second fixed capacitive electrodes, and a DC biasing element arranged to apply a DC voltage ($V_B$) to the proof mass based on a threshold acceleration value. A first closed loop circuit is arranged to detect a signal resulting from displacement of the proof mass and control the pulse width modulation signal generator to apply the first and second drive signals $V_1$, $V_2$ with a variable mark:space ratio. A second closed loop circuit keeps the mark:space ratio constant and to change the magnitude, $V_B$, of the DC voltage applied to the proof mass by the DC biasing element so as to provide a net electrostatic restoring force on the proof mass for balancing the inertial force of the applied acceleration and maintaining the proof mass at a null position, when the applied acceleration is greater than a threshold acceleration value.

15 Claims, 15 Drawing Sheets

(51) Int. Cl.
    *G01L 1/14*         (2006.01)
    *G01P 21/00*       (2006.01)

(56) References Cited

U.S. PATENT DOCUMENTS

| | | |
|---|---|---|
| 7,267,006 B2 | 9/2007 | Malvern |
| 11,249,106 B2 | 2/2022 | Fell et al. |
| 2001/0032508 A1 | 10/2001 | Lemkin et al. |
| 2003/0052699 A1 | 3/2003 | Lasalandra et al. |
| 2013/0057301 A1 | 3/2013 | Balachandran et al. |
| 2016/0011014 A1 | 1/2016 | Entringer et al. |
| 2017/0089947 A1 | 3/2017 | Townsend et al. |
| 2017/0146562 A1 | 5/2017 | Durston et al. |
| 2018/0128851 A1* | 5/2018 | Malvern ............... G01P 15/131 |
| 2019/0277877 A1 | 9/2019 | Smith et al. |

FOREIGN PATENT DOCUMENTS

| | | |
|---|---|---|
| WO | 2004076340 A1 | 9/2004 |
| WO | 2015140537 A1 | 9/2015 |
| WO | 2015185937 A1 | 12/2015 |

\* cited by examiner

Figure 1 – (PRIOR ART)

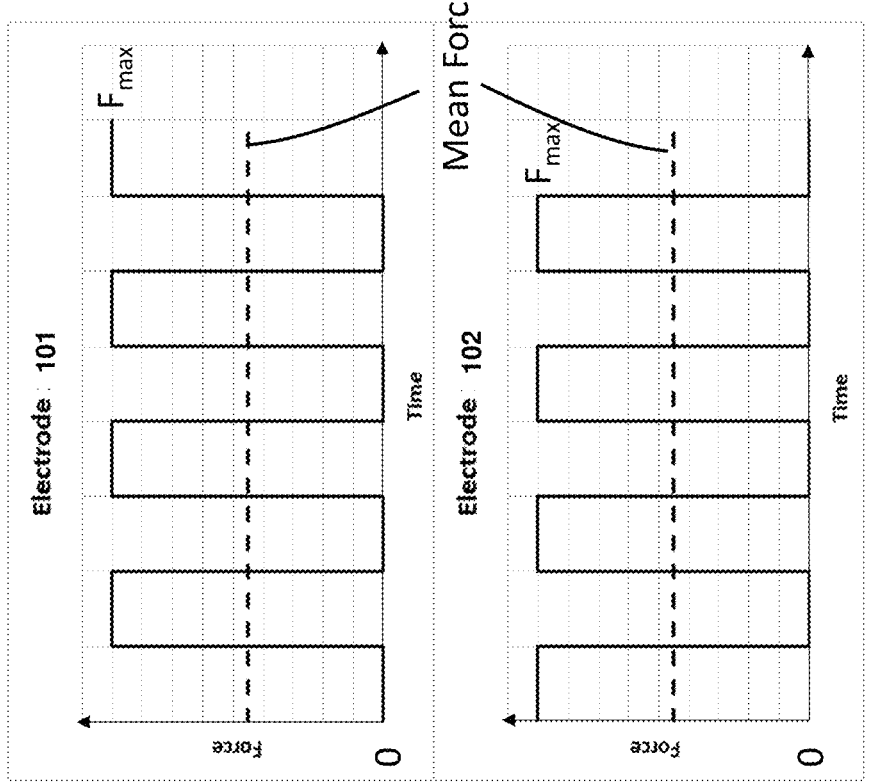
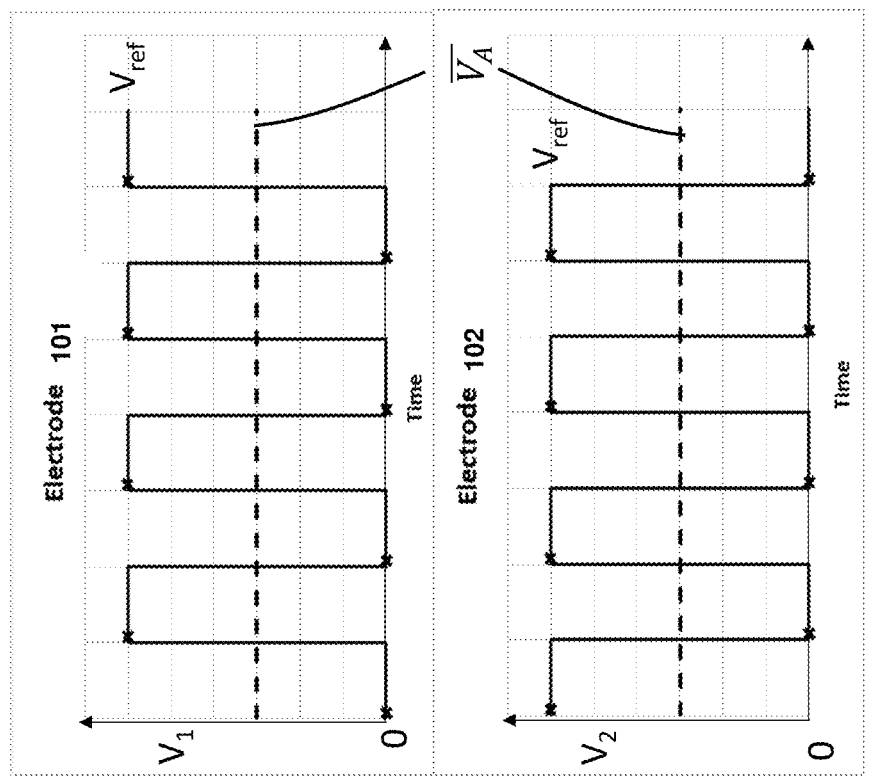
Figure 2 (PRIOR ART)

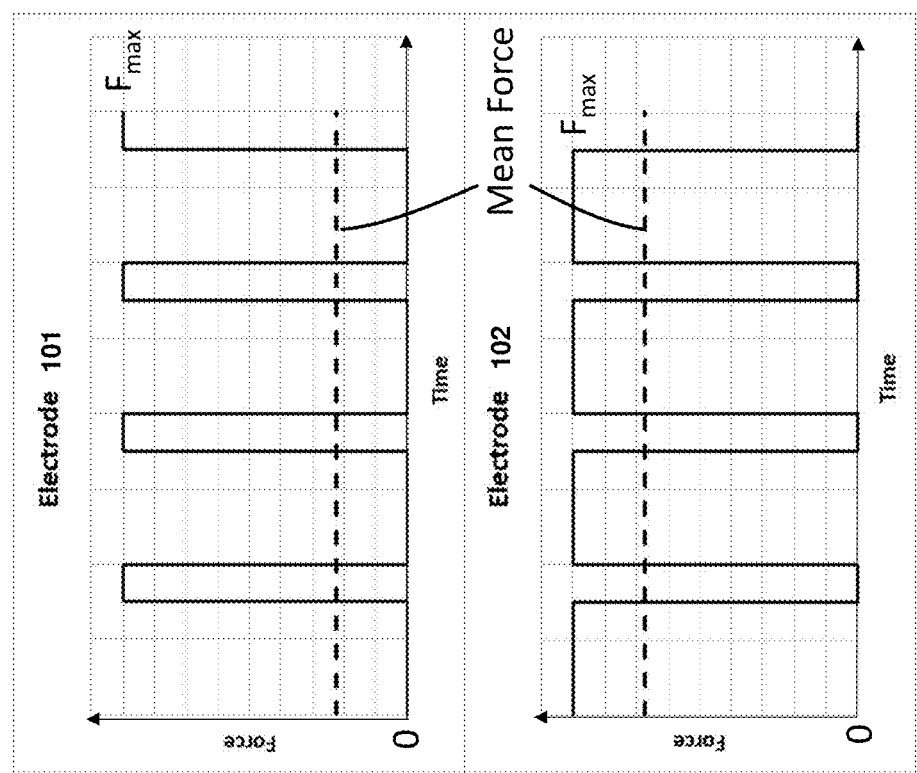
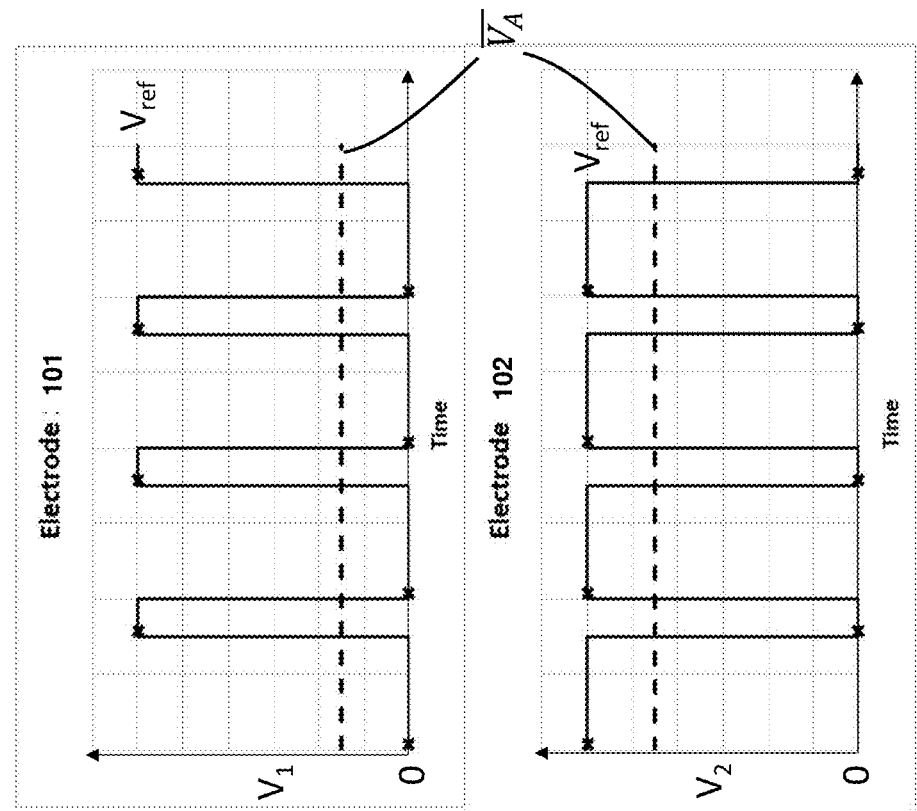
Figure 3 (PRIOR ART)

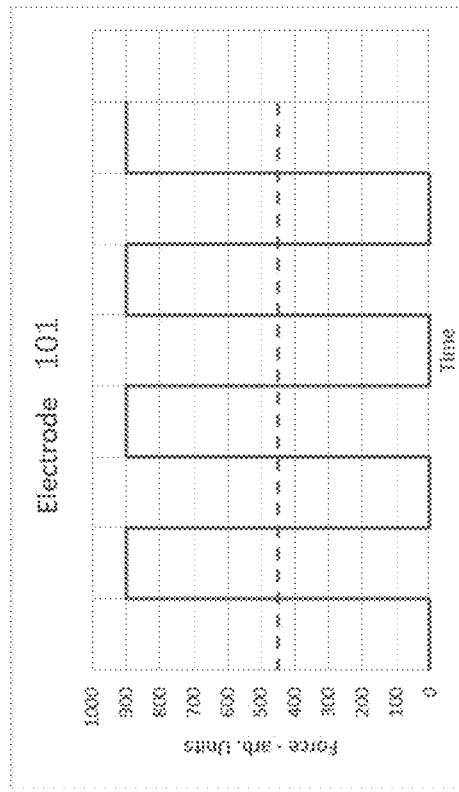
Fig. 11a
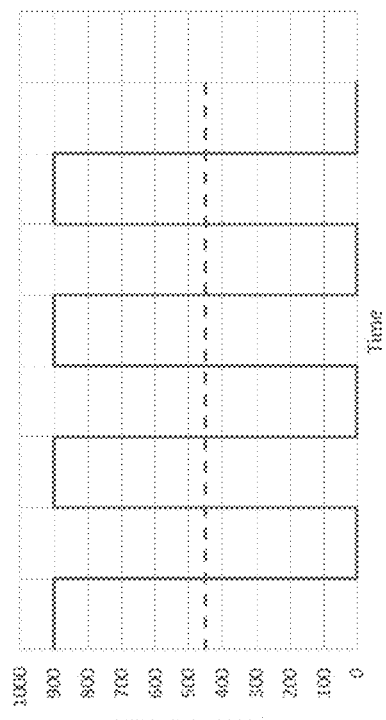
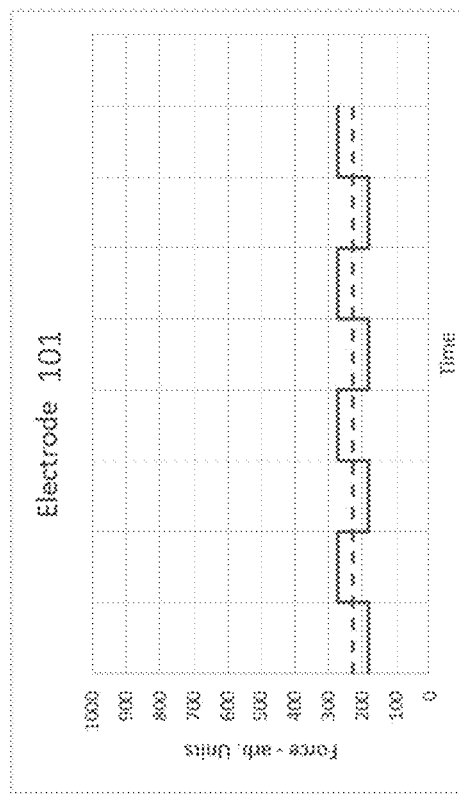
Fig. 11b
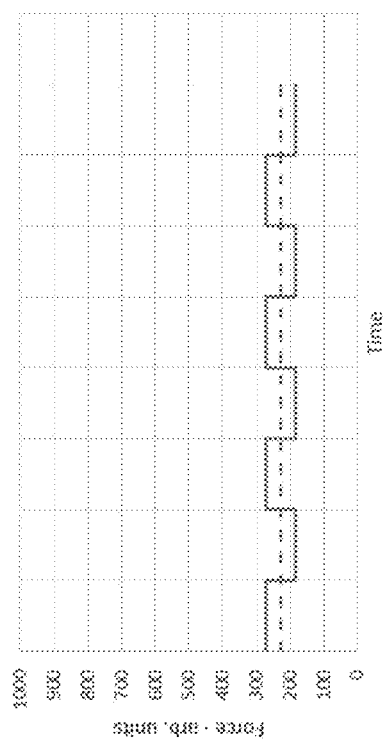

METHODS FOR CLOSED LOOP OPERATION OF CAPACITIVE ACCELEROMETERS

FOREIGN PRIORITY

This application claims priority to European Patent Application No. 20275030.3 filed Feb. 7, 2020, the entire contents of which is incorporated herein by reference.

TECHNICAL FIELD

The present disclosure relates to capacitive accelerometers and their control schemes, and in particular to methods for closed loop operation of capacitive accelerometers, especially over wide acceleration ranges.

BACKGROUND

Accelerometers are electromechanical devices that are widely used to measure acceleration forces due to motion and/or vibration. Capacitive accelerometers may find use in applications including seismic sensing, vibration sensing, inertial sensing and tilt sensing. Capacitive accelerometers are typically implemented as micro electromechanical systems (MEMS) and may be manufactured from a semiconductor material such as silicon. A typical MEMS sensing structure for a capacitive accelerometer comprises a proof mass moveably mounted to a support, with a set of electrode fingers extending from the proof mass being interdigitated with one or more sets of fixed electrode fingers so as to form a differential capacitor. The electrodes of the sensing structure are connected to suitable drive and pickoff electronics.

In an open loop configuration, the electronics are arranged to drive the fixed electrode fingers with any suitable waveform, which may be sine or square wave signals, such that when the proof mass moves under acceleration a pickoff voltage signal appears on the output. WO 2004/076340 provides an example of an open loop accelerometer. In the open loop configuration, the AC signal detected on the proof mass can be used to generate a signal indicative of the applied acceleration. The amplitude of the detected signal on the proof mass from a single fixed electrode will vary $\infty$ $V/d^2$, where V is the differential voltage between the electrode and proof mass, and d is the gap size. The signal level will therefore vary quadratically with the gap, which varies linearly with applied acceleration. This gives a non-linear scale factor which must subsequently be corrected in order to achieve high performance. The vibration rectification error may be large due to the non-linear signal response. Also, the small gap size (typically a few microns) limits the motion and hence the operational dynamic range of the device. Open loop accelerometers can have limited performance in terms of bandwidth, linearity and dynamic range.

An accelerometer sensing structure designed for open loop operation can also be used in a closed loop configuration by using drive electronics to provide a variable electrostatic force to the electrodes to achieve force balancing. In a closed loop mode, the proof mass is maintained in a fixed position at all times by the application of electrostatic forces. The output is then given by the applied force. U.S. Pat. No. 7,267,006 provides an example of a closed loop electronic control scheme using pulse width modulation (PWM) of the drive signals. In such a closed loop configuration, the electronics are arranged to drive pairs of the fixed electrode fingers with in-phase and anti-phase AC square wave voltage signals. The drive signals have a waveform varying in amplitude between zero and a maximum value $V_{ref}$ which is typically 30 V with respect to the proof mass which is biased to 0V, in order to give the force required to achieve a 70 g dynamic range. The mark:space ratio of the PWM drive scheme can be adjusted, depending on the applied acceleration, to change the average DC voltage, $\overline{V_A}$, of each drive signal with respect to the proof mass and hence the feedback force. The mark:space ratio can therefore be used to generate an output signal which varies linearly with the applied acceleration level. This design has been demonstrated to give high dynamic range, good linearity, high bandwidth and low vibration rectification error.

A known problem which can degrade the performance of many capacitive sensors is dielectric charging which can occur in the presence of DC offset voltages. This effect involves the charging of thin dielectric layers on the electrode plate surfaces due to the migration of charged species (electrons and ions) in the presence of electrical field gradients. The high field gradients are present due to the differential voltage between the fixed and movable electrodes, which are particularly large for closed loop type accelerometers such as described in U.S. Pat. No. 7,267,006. The proof mass and electrode structures for this type of device are typically fabricated from bulk crystalline silicon using deep reactive ion etching techniques. Such techniques will typically produce a thin surface layer of native oxide on the electrode surfaces which grows naturally after the silicon surface is exposed by etching and prior to sealing of the device. Charged species, such as sodium and lithium, will be present due to the anodic bonding of upper and lower glass wafer layers which encapsulate the silicon proof mass and electrode structures. The build-up of these charges in the dielectric surface layers on the electrodes means that some of the voltage, $V_{ref}$ is dropped across the dielectric layer and the effective average voltage, $\overline{V_A}$, across the gap, d, is changed. This will therefore cause a corresponding change in the transducer gain which will adversely affect the device performance.

Dielectric charging is known to cause slow shifts in both bias and scale factor under constant operating conditions. The slow nature of the charge migration means that the charges will not respond to high frequency AC voltage modulation but will migrate in the presence of fixed voltage gradients. These effects typically occur more rapidly at elevated temperatures where the ion mobility is increased, and will tend to reach a steady state over time. The charge will however dissipate once the voltage has been removed and the bias and scale factor shifts have been shown to relax back towards the original starting levels once the device is switched off. The effects will however recur when the device is subsequently powered on again.

The Applicant's co-pending application (124468GB01) describes a way of removing the problematic DC voltage offset in the device described in U.S. Pat. No. 7,267,006 by utilising modified AC voltage waveforms to eliminate the voltage gradients driving the charge migration. This approach can however significantly reduce the acceleration range of the device as the differential voltage between the proof mass and electrodes is reduced for a given value of $V_{ref}$. Also, the modified waveforms require significant changes to the control electronics, which are typically in the form of an ASIC, which may be time consuming and costly to implement.

SUMMARY

According to a first aspect of this disclosure, there is provided a method for closed loop operation of a capacitive accelerometer. The capacitive accelerometer comprising: a proof mass moveable along a sensing axis in response to an applied acceleration; and first and second fixed capacitive electrodes arranged symmetrically either side of the proof mass along the sensing axis with a gap defined between each of the first and second fixed capacitive electrodes and the proof mass under zero applied acceleration. The method includes: applying a DC voltage of magnitude $V_B$ to the proof mass based on a threshold acceleration value; applying a first drive signal $V_1$ to the first fixed capacitive electrode, a second drive signal $V_2$ to the second fixed capacitive electrode, the first and second drive signals each having a periodic waveform varying in amplitude between zero and a maximum value; sensing a displacement of the proof mass in response to an applied acceleration; determining whether the applied acceleration is greater than the threshold acceleration value; in response to determining that the applied acceleration is not greater than the threshold acceleration value, applying pulse width modulation to the first and second drive signals $V_1$, $V_2$ with a variable mark/space ratio so as to provide a net electrostatic restoring force on the proof mass for balancing the inertial force of the applied acceleration and maintaining the proof mass at a null position; and in response to determining that the applied acceleration is greater than the threshold acceleration value, applying pulse width modulation to the first and second drive signals $V_1$, $V_2$ with a constant mark/space ratio, and changing the magnitude, $V_B$, of the DC voltage applied to the proof mass so as to provide a net electrostatic restoring force on the proof mass for balancing the inertial force of the applied acceleration and maintaining the proof mass at a null position.

Methods as disclosed herein provide a modified closed loop scheme which provides optimised operation of a capacitive accelerometer which substantially reduces the effects of dielectric charging while allowing for both operation at high g-ranges, and compatibility with existing control electronics.

As will be described further below, by applying a DC voltage of magnitude $V_B$ to the proof mass, the mean voltage offset between each of the electrodes and the proof mass is substantially reduced for acceleration levels below the threshold value. Accelerometers in which the methods as disclosed herein are applied (such as those used within inertial measurement units) are typically subject to high acceleration levels infrequently.

Reducing the mean voltage offset between the electrodes and the proof mass reduces the sensitivity of such an accelerometer to charge migration induced errors when operating below the threshold acceleration value, and does not require substantial modification of control electronics of the type typically used in the prior art. Changing the magnitude, $V_B$, of the DC voltage applied to the proof mass of an accelerometer in which methods as disclosed herein are applied allows high acceleration range capability to be maintained.

In at least some examples, the periodic waveform of the first and second drive signals may be substantially a square waveform, comprising a waveform sequence stepping to a maximum value when the other drive signal is at zero. In other examples, the first and second drive signals may comprise any other suitable waveform having such a sequence, for example triangular or trapezoidal waveforms instead of a square waveform. In other examples, the first and second drive signals may comprise a sine-based waveform.

In at least some examples, the magnitude, $V_B$, of the DC voltage applied to the proof mass for applied acceleration values below the threshold acceleration value is chosen to be approximately half of the maximum value of the amplitude of the drive signals $V_1$, $V_2$.

In one or more examples, in addition or alternatively, changing the magnitude $V_B$ of the DC voltage applied to the proof mass comprises: applying a voltage offset, represented by β, wherein β=$β_0$ is constant for an applied acceleration below the threshold acceleration value and wherein β increases linearly with applied acceleration for an applied acceleration above the threshold acceleration value. It will therefore be understood that the value of β is limited to values ≥$β_0$.

In at least some examples, the constant $β_0$ is chosen such that the magnitude $V_B$ is approximately half of the maximum value of the amplitude of the first and second drive signals $V_1$, $V_2$.

In at least some examples, in addition or alternatively, wherein β increases linearly with applied acceleration up to a maximum of ±1 corresponding to setting the magnitude $V_B$ equal to zero or the maximum value of the amplitude of the first and second drive signals $V_1$, $V_2$.

In a first set of examples, β is determined by: determining the applied acceleration; calculating a ratio of the applied acceleration and the threshold acceleration value to define a scale factor X that increases linearly with the applied acceleration above the threshold acceleration value; and applying the scale factor X to the constant $β_0$ to give a resultant value for β. In such examples, the value of the scale factor X is limited to values ≥1.

In a second set of examples, is determined by: determining a parameter αD related to the mark/space ratio; subtracting a threshold value an from the absolute value of $α_D$; above the threshold acceleration value, increasing or decreasing the value of β so as to zero the value of $|α_D|-α_{Th}$.

In one or more examples, in addition or alternatively, the threshold acceleration value is selected to have a magnitude between 1 g and 5 g. In at least some examples, the threshold acceleration value is selected to have a magnitude of about 1.5 g.

In one or more examples, in addition or alternatively, the method further comprises outputting a signal indicative of the applied acceleration.

In one or more examples, in addition or alternatively, the capacitive accelerometer comprises a silicon MEMS structure.

In one or more examples, in addition or alternatively, the proof mass is substantially planar.

In one or more examples, in addition or alternatively, the proof mass is mounted to a fixed substrate by flexible support legs so as to be linearly moveable in a plane along the sensing axis in response to an applied acceleration, and wherein the first and second fixed capacitive electrodes are formed in the fixed substrate in the same plane.

In one or more examples, in addition or alternatively, the proof mass comprises first and second sets of moveable capacitive electrode fingers extending from the proof mass, substantially perpendicular to the sensing axis and spaced apart along the sensing axis; and the first and second fixed capacitive electrodes comprise, respectively, first and second sets of fixed capacitive electrode fingers extending substantially perpendicular to the sensing axis and spaced apart along the sensing axis; and the first set of fixed capacitive electrode fingers is arranged to interdigitate with the first set of moveable capacitive electrode fingers with a first offset in one direction along the sensing axis from a median line between adjacent fixed capacitive electrode fingers, and the second set of fixed capacitive electrode fingers is arranged to interdigitate with the second set of moveable capacitive electrode fingers with a second offset in the opposite direction along the sensing axis from a median line between adjacent fixed capacitive electrode fingers.

According to a second aspect of this disclosure, there is provided a capacitive accelerometer that includes a proof mass moveable along a sensing axis in response to an applied acceleration. The capacitive accelerometer also includes: first and second fixed capacitive electrodes arranged symmetrically either side of the proof mass along the sensing axis with a gap defined between each of the first and second fixed capacitive electrodes and the proof mass under zero applied acceleration; a DC biasing element arranged to apply a DC voltage of magnitude $V_B$ to the proof mass based on a threshold acceleration value; a pulse width modulation signal generator arranged to apply a first drive signal $V_1$ to the first fixed capacitive electrode and a second drive signal $V_2$ to the second fixed capacitive electrode, the first and second drive signals each having a periodic waveform varying in amplitude between zero and a maximum value; a first closed loop circuit arranged to detect a signal resulting from displacement of the proof mass and control the pulse width modulation signal generator to apply the first and second drive signals $V_1$, $V_2$ with a variable mark:space ratio so as to provide a net electrostatic restoring force on the proof mass for balancing the inertial force of the applied acceleration and maintaining the proof mass at a null position, when the applied acceleration is not greater than a threshold acceleration value; and a second closed loop circuit arranged to keep the mark:space ratio constant and to change the magnitude, $V_B$, of the DC voltage applied to the proof mass by the DC biasing element so as to provide a net electrostatic restoring force on the proof mass for balancing the inertial force of the applied acceleration and maintaining the proof mass at a null position, when the applied acceleration is greater than a threshold acceleration value.

In one or more examples, the second closed loop circuit is arranged to change the magnitude $V_B$ of the DC voltage applied to the proof mass by applying a voltage offset, represented by $\beta$, wherein $\beta=\beta_0$ is constant for an applied acceleration below the threshold acceleration value and wherein $\beta$ increases linearly with applied acceleration for an applied acceleration above the threshold acceleration value. As mentioned above, the value of $\beta$ is limited to values $\geq \beta_0$.

In at least some examples, the constant $\beta_0$ is chosen such that the magnitude $V_B$ is approximately half of the maximum value of the amplitude of the first and second drive signals $V_1$, $V_2$.

In at least some examples, in addition or alternatively, $\beta$ increases linearly with applied acceleration up to a maximum of ±1 corresponding to setting the magnitude $V_B$ equal to zero or the maximum value of the amplitude of the first and second drive signals $V_1$, $V_2$.

In a first set of examples, $\beta$ is determined by: determining the applied acceleration; calculating a ratio of the applied acceleration and the threshold acceleration value to define a scale factor X that increases linearly with the applied acceleration above the threshold acceleration value; and applying the scale factor X to the constant $\beta_0$ to give a resultant value for $\beta$. In such examples, the value of the scale factor X is limited to values $\geq 1$.

In a second set of examples, $\beta$ is determined by: determining a parameter $\alpha_D$ related to the mark/space ratio; subtracting a threshold value $\alpha_{Th}$ from the absolute value of $\alpha_D$; above the threshold acceleration value, increasing or decreasing the value of $\beta$ so as to zero the value of $|\alpha_D|-\alpha_{Th}$.

In one or more examples, in addition or alternatively, the threshold acceleration value is selected to have a magnitude between 1 g and 5 g. In at least some examples, the threshold acceleration value is selected to have a magnitude of about 1.5 g.

In one or more examples, in addition or alternatively, the capacitive accelerometer comprises a silicon MEMS structure.

In one or more examples, in addition or alternatively, the proof mass is mounted to a fixed substrate by flexible support legs so as to be linearly moveable in a plane along the sensing axis in response to an applied acceleration, and wherein the first and second fixed capacitive electrodes are formed in the fixed substrate in the same plane.

In one or more examples, in addition or alternatively, the proof mass is substantially planar.

In one or more examples, in addition or alternatively, the proof mass comprises first and second sets of moveable capacitive electrode fingers extending from the proof mass, substantially perpendicular to the sensing axis and spaced apart along the sensing axis; and the first and second fixed capacitive electrodes comprise, respectively, first and second sets of fixed capacitive electrode fingers extending substantially perpendicular to the sensing axis and spaced apart along the sensing axis; and the first set of fixed capacitive electrode fingers is arranged to interdigitate with the first set of moveable capacitive electrode fingers with a first offset in one direction along the sensing axis from a median line between adjacent fixed capacitive electrode fingers, and the second set of fixed capacitive electrode fingers is arranged to interdigitate with the second set of moveable capacitive electrode fingers with a second offset in the opposite direction along the sensing axis from a median line between adjacent fixed capacitive electrode fingers.

BRIEF DESCRIPTION OF THE DRAWINGS

One or more non-limiting examples will now be described with reference to the accompanying drawings, in which:

FIG. 2 shows the applied voltage waveforms and resultant electrostatic forces for electrodes 1 and 2, for a 50:50 mark:space ratio under a zero applied acceleration condition, according to the prior art;

FIG. 3 shows the applied voltage waveforms and resultant electrostatic forces for electrodes 1 and 2, for a 25:75 mark:space ratio under a positive applied acceleration condition, according to the prior art;

FIGS. 11a and 11b show a comparison of the resultant electrostatic forces for electrodes 1 and 2, for a 50:50 mark:space ratio under a zero applied acceleration condition, according to examples of the present disclosure and the prior art;

DETAILED DESCRIPTION

Figure 1:
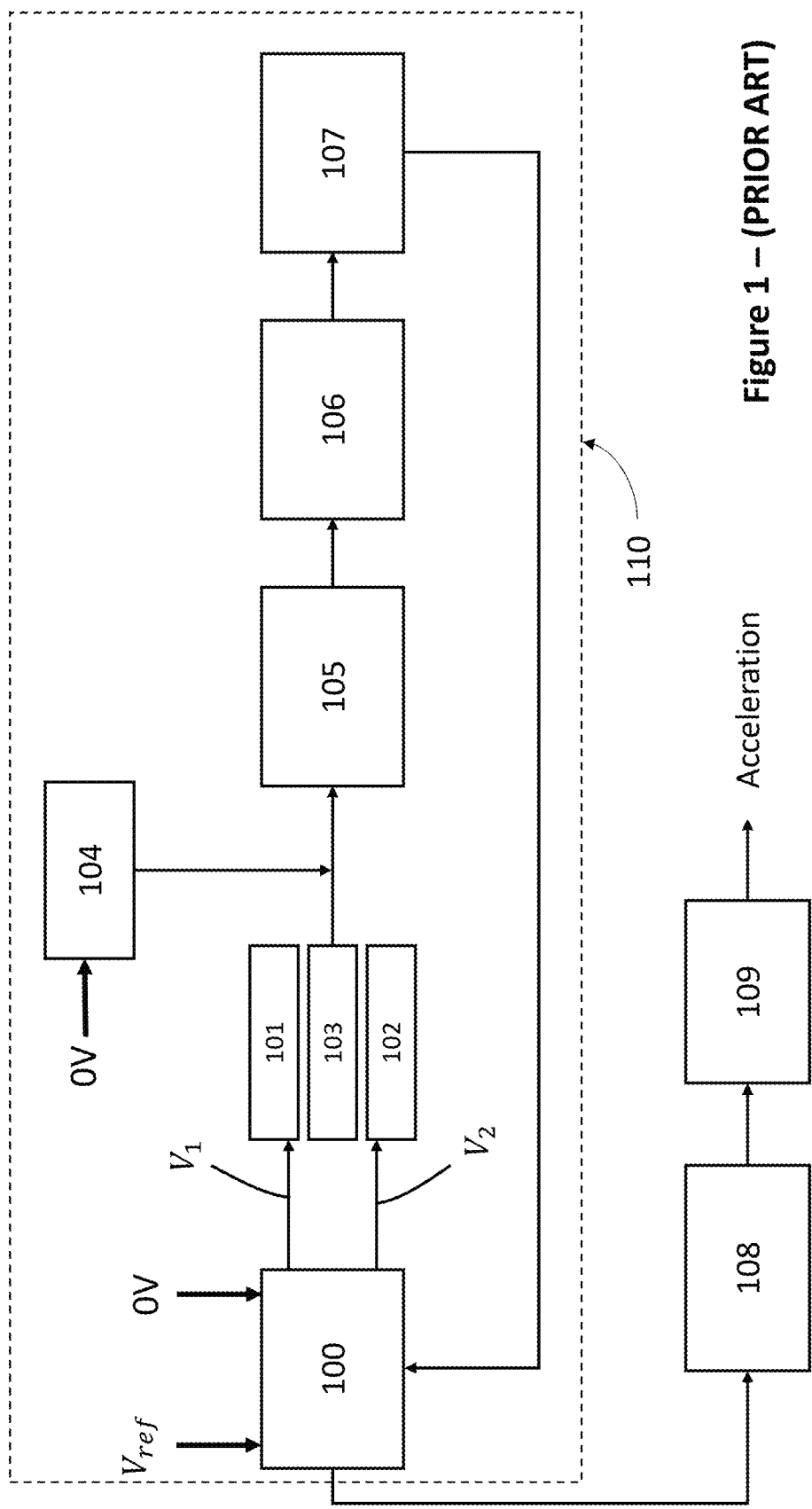
FIG. 1 schematically illustrates a known electronic control scheme for a closed loop capacitive accelerometer according to the prior art.

There is generally seen in FIG. 1 a known electronic control scheme for a closed loop capacitive accelerometer according to the prior art exemplified by U.S. Pat. No. 7,267,006, the contents of which are hereby incorporated by reference. A pulse width modulation (PWM) signal generator 100 receives a constant fixed reference voltage $V_{ref}$ and supplies complementary first and second drive voltages $V_1$ and $V_2$ to a first electrode 101 and a second electrode 102. Electrodes 101 and 102 typically take the form of first and second sets of fixed capacitive electrode fingers that interdigitate with the moveable capacitive electrode fingers of the proof mass 103, as is well known in the art.

A pre-amplifier (pre-amp) 105 is arranged to sample an output signal at the proof mass 103. As illustrated in FIG. 1, the pre-amp 105 is configured so that its input from the proof mass 103 is a "virtual earth" where the voltage for the "earth" is 0 V, which is achieved by a DC biasing element 104 such as a resistor. The pre-amp 105 then forces the proof mass DC bias voltage to be the same as the voltage (e.g. 0 V) supplied by the DC biasing element 104, whereas periodic signals are picked up by the pre-amp 105 in response to movement of the proof mass 103. These periodic pick-off signals are then demodulated by a demodulator 106 and passed through a loop filter 107 before being fed back to the pulse width modulation (PWM) signal generator 100 in closed loop operation using a control loop 110. When an acceleration is applied to the accelerometer, the signal generated by the displacement of the proof mass 103 is fed back into the control loop 110 which adjusts the mark:space ratio of the PWM drive signals $V_1$, $V_2$. This differentially changes the forces between the fixed electrodes 101, 102 and proof mass 103 to drive the proof mass 103 back to the null position. In order to output a signal indicative of the applied acceleration, the mark:space ratio may be calculated at block 108 from the signal generator 100 and filtered at block 109 in order to output the measured acceleration.

FIG. 2, also taken from the prior art, shows the first and second drive signals $V_1$, $V_2$ applied to the fixed electrodes 101 and 102 according to the prior art, and the resultant force on each electrode. FIG. 2 illustrates that the first and second drive signals $V_1$, $V_2$ have a standard square waveform varying in amplitude between zero and a maximum value $V_{ref}$, which is typically 30 V in order to give the force required to achieve a 70 g dynamic range. With zero applied acceleration, when the gaps d between the proof mass electrode 103 and each of the two fixed electrodes 101, 102 are nominally equal, the waveforms consist of a square wave with a 50:50 mark:space ratio. The resultant force, F, for each electrode 101, 102 is given by:

$$F = \frac{CV^2}{d}$$

where C is the gap capacitance and V is the voltage. The mean voltage level $\overline{V_A}$ for a 50:50 mark:space waveform, as shown by the dashed line, is equal to $V_{ref}/2$. The corresponding mean force will therefore similarly be half of the peak value, and is also shown as a dashed line in FIG. 2. As the fixed electrodes 101, 102 are located at opposite sides of the proof mass 103, the forces act in opposite directions and therefore, the net force acting on the proof mass 103 will be zero. These waveforms are conveniently modulated at a very high frequency (e.g. $f_{mod}$~100 kHz) compared to the mechanical resonant frequency of the proof mass 103, which is critically damped, and therefore no significant motion occurs at this frequency.

The mark:space ratio may be conveniently defined by a value, a, which varies between 0 and 1 with a 50:50 mark:space ratio therefore corresponding to an a value of 0.5. The net force is given by:

$$F = V_{ref}^2 \left[ \frac{C_1 \alpha}{2d_1} - \frac{C_2(1-\alpha)}{2d_2} \right]$$

Where $d_1$ and $d_2$ refer to the electrode 1 and 2 capacitor gaps respectively. The waveforms and resultant forces for an exemplary positive acceleration, giving rise to a 25:75 mark:space ratio, are shown in FIG. 3. The reduced pulse width applied to electrode 101 results in a reduced mean voltage and thus a reduced mean force while the mean voltage and mean force increases for electrode 102. The mean net force on the proof mass 103 is given by the differential force between electrodes 101 and 102. The individual mean force produced by each drive signal is non-linear, but the two operating together cancels the non-linearity and produces a net force which varies linearly with respect to the mark:space ratio.

In such a prior art capacitive accelerometer, dielectric charging arises due to the large mean DC voltages, $\overline{V_A}$, between the fixed electrodes 101, 102 and the proof mass 103. These voltage levels will also vary depending on the applied acceleration level thus changing the charging characteristics. In the control scheme of FIG. 1, applying a voltage level of 30 V for $V_{ref}$ results in a $\overline{V_A}$ of 15 V between each of the fixed electrodes 101, 102 and the proof mass 103 which generates large, opposing forces on the proof mass 103 even when 0 g is applied. The mean voltage offsets will vary depending on the applied g level, however, large offsets will typically be present at all times in any practical application.

This scheme has the advantage that it provides a wide acceleration range due to the large $\overline{V_A}$ voltages (and hence large net feedback force) which may be applied however this is disadvantageous in terms of charge migration. The effect of the charge migration is to alter the effective $\overline{V_A}$ between the proof mass 103 and adjacent electrodes 101, 102. Where the charge migration is uniform between the two electrodes 101, 102 only scale factor will be affected (Scale factor c feedback force) while non-uniform changes will also induce bias errors.

For the design of U.S. Pat. No. 7,267,006, large forces are present on both fixed electrodes 101, 102 at all times. In order to achieve a ±70 g dynamic range, the net force applied by the electrodes 101, 102 to the proof mass needs to be sufficient to maintain the proof mass 103 in a fixed position when the mark:space ratio is at a limiting value of e.g. 90:10 or 10:90 (i.e. the magnitude of the force on one electrode needs to be equivalent to ~77.8 g while the opposing force is ~7.8 g). Around zero g, where the mark:space ratio is 50:50, the mean voltage and hence the resultant forces on each electrode 101, 102 will be equal (see FIG. 2) and will be equivalent to ~±38.9 g. Any small changes in the effective gain of the fixed electrodes 101, 102 can therefore result in a large change in the drive force. The force on each electrode 101, 102 is proportional to $\overline{V_A}^2$ so the resultant force, and hence the bias, is highly sensitive to any differential charge migration-induced changes. Bias errors may also be induced by packaging-induced stress and strain which can differentially change the capacitor gaps.

The charge migration rate and magnitude are significantly affected by the voltage gradient between the proof mass 103 and the fixed electrodes 101, 102. Reducing $V_{ref}$ and hence the mean voltages $\overline{V_A}$ across the electrode to proof mass capacitor gaps, would therefore enable the charge migration-induced changes in scale factor and bias to be reduced. This will however be highly detrimental in terms of reducing the overall acceleration range as the net feedback force varies ∞ $V_{ref}$. Reducing $V_{ref}$ would also be detrimental in terms of signal to noise performance as the signal level varies ∞ $V_{ref}$.

High performance accelerometers are typically utilised in Inertial Measurement Units (IMU) with three separate accelerometers mounted along orthogonal axes. While such accelerometers may be capable of measuring high acceleration levels, even in applications where they are subjected to high acceleration or vibration inputs, this is generally only for relatively short periods of time and the IMU will typically be subjected to a much less dynamic environment or may even be stationary for the majority of the time. When stationary, the maximum g level that will be applied to any accelerometer will be ±1 g, depending on the orientation of the IMU with respect to earth's gravitational vector.

This requirement for high acceleration range capability is the primary factor that necessitates the use of the high offset voltages used for the devices described in U.S. Pat. No. 7,267,006 in order to provide high force feedback capability. Reducing the average bias offset voltages, $\overline{V_A}$, for the time periods when the accelerometer is in a low g environment would enable the detrimental effects of the high offset voltage (i.e. charge migration and large opposing electrode forces) to be substantially reduced.

Examples of the present disclosure therefore provide a means to significantly reduce the magnitude of the mean voltage offsets, $\overline{V_{A1}}$ and $\overline{V_{A2}}$, between electrodes 101 and 102 (respectively) and the proof mass 103, for acceleration levels around zero g and up to a pre-defined absolute threshold level e.g. around zero g or relatively close to zero g. This is achieved by setting the value of $V_B$ close to $V_{ref}/2$. Conveniently the threshold may be set to positive or negative acceleration values of >|1| g and <|5| g. Above the threshold acceleration value, the voltage offset between $V_B$ and $V_{ref}/2$ is increased linearly with increasing acceleration levels up to a maximum level. This provides advantages compared to the design of U.S. Pat. No. 7,267,006 in terms of reduced bias sensitivity to charge migration-induced errors while maintaining the same overall acceleration range capability. It therefore provides similar advantages to the scheme described in the Applicant's co-pending application (124468GB01) without compromising the overall acceleration range capability.

Conveniently, the waveforms utilised in examples of the present disclosure may be identical to those of U.S. Pat. No. 7,267,006 (or other known force nulling control schemes) with the $V_B$ level adjusted based on the applied acceleration level. This has the further significant advantage that standard or pre-existing control electronics, typically implemented in ASIC form, may be used without substantial modification except for the addition of only a small amount of additional external circuitry. Adjusting the value of $V_B$ varies the drive gain however the signal gain, which determines the signal to noise performance of the device, is unaffected as this is set by the peak to peak variation in the periodic waveforms applied to the fixed electrodes, which is unchanged. Details of an exemplary implementation are given below.

Figure 4:
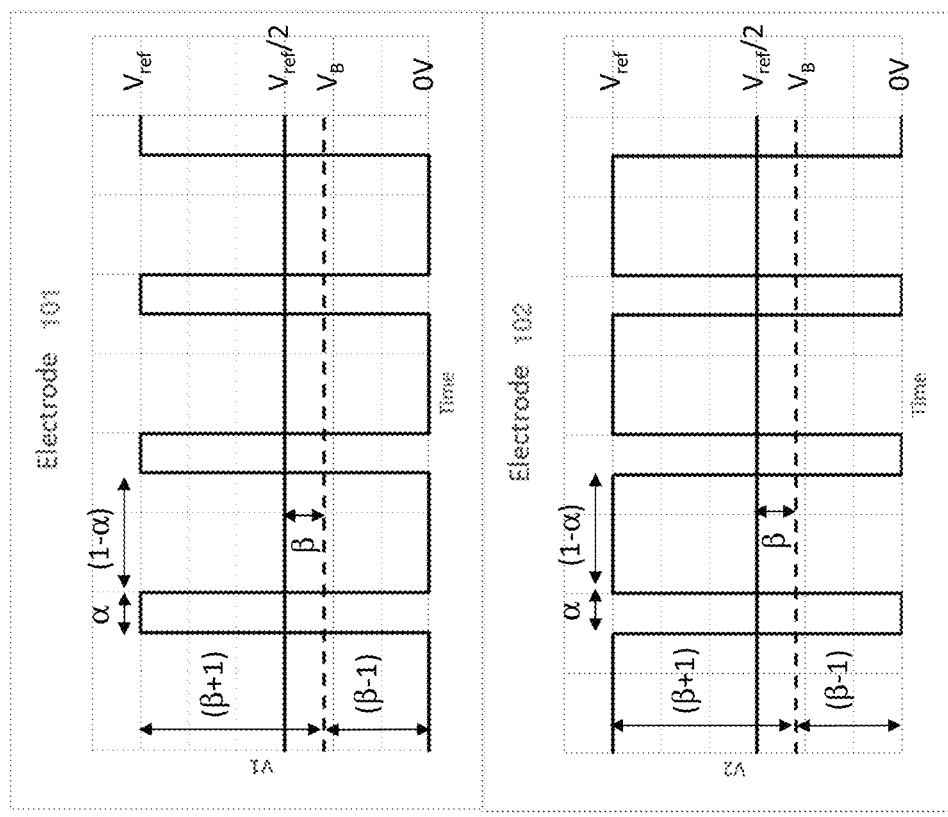
FIG. 4 illustrates the definition of the parameters $\alpha$ and $\beta$ for the electrode 1 and electrode 2 waveforms of the present disclosure.

According to examples of the present disclosure, the periodic voltage waveforms applied to electrodes 101 and 102 are conveniently described as shown schematically in FIG. 4. The mark:space ratio is defined by the value α and the ratio-metric offset between $V_B$ and $V_{ref}/2$ is defined as $\beta=(V_{ref}/2-V_B)/[V_{ref}/2]$, which can vary between ±1. When $\beta=1$ the bias voltage offset, $V_B$, will be 0V and when $\beta=-1$, $V_B$ will be a maximum ($=V_{ref}$). As described above, the first and second drive signals $V_1$, $V_2$ have a periodic waveform varying in amplitude between zero and a maximum value $V_{ref}$. Thus the maximum value of β being ±1 corresponds to setting the magnitude $V_B$ equal to zero or the maximum value of the amplitude of the first and second drive signals $V_1$, $V_2$.

The time averaged voltage of each fixed electrode 101, 102 with respect to the proof mass 103 is then given by:

$$V_{A1}=0.5\times V_{Ref}\times[\alpha(1+\beta)+(1-\alpha)(\beta-1)] \quad (1)$$

$$V_{A2}=0.5\times V_{Ref}\times[\alpha(\beta-1)+(1-\alpha)(1+\beta)] \quad (2)$$

The developed force, which is proportional to the square of these voltages, is then given by:

$$F_1 \propto [\alpha(1+\beta)^2+(1-\alpha)(\beta-1)^2] \quad (3)$$

$$F_2 \propto [\alpha(\beta-1)^2+(1-\alpha)(1+\beta)^2] \quad (4)$$

The net feedback force is then given by:

$$F_1-F_2 \propto 4\beta(2\alpha-1) \quad (5)$$

where β represents a voltage offset to be applied to the magnitude $V_B$ of the DC voltage on the proof mass, and α is a parameter related to the mark:space ratio.

Figure 5:
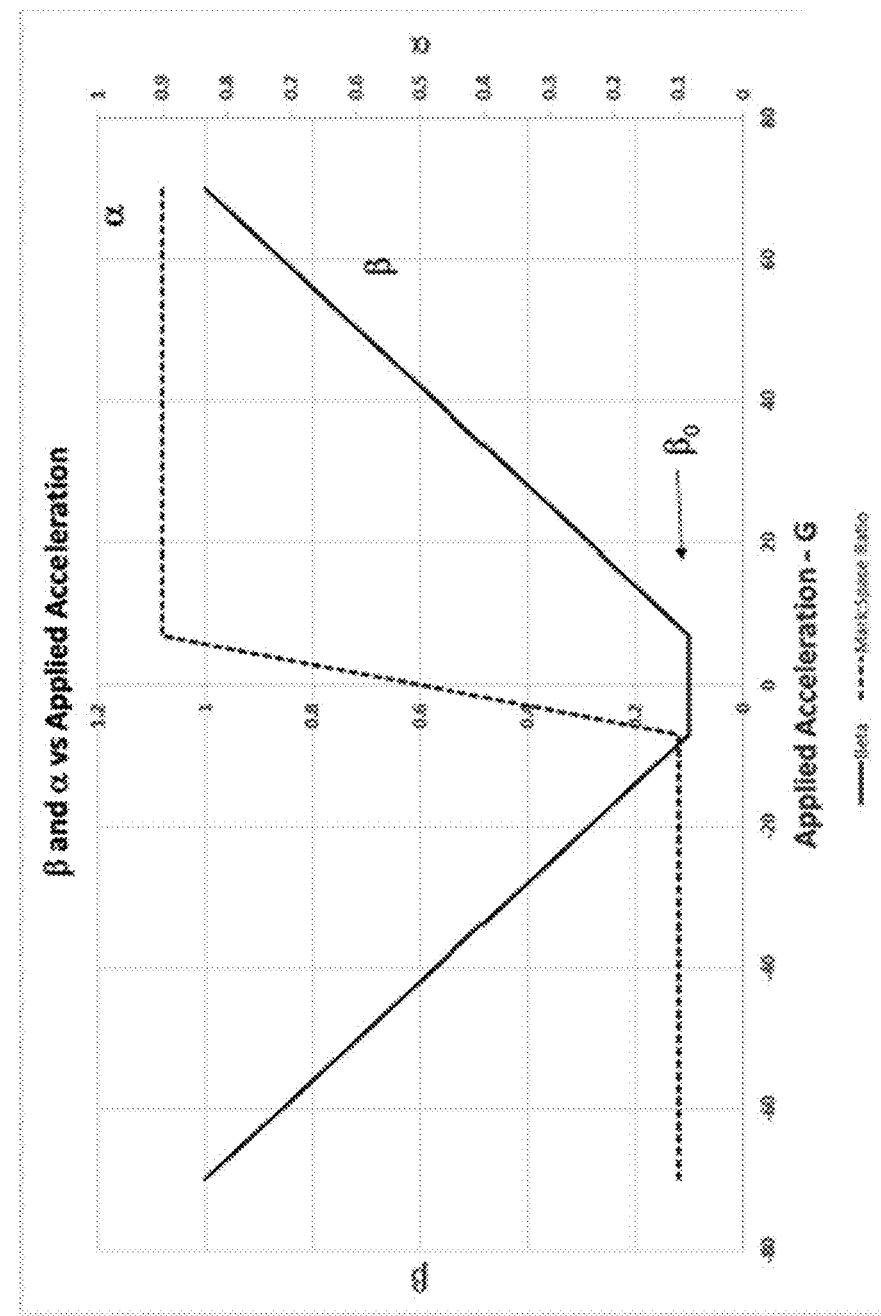
FIG. 5 illustrates the variation of the parameters $\alpha$ and $\beta$ as a function of applied acceleration for the present disclosure.

It can be seen that the feedback force varies linearly with both α, and with β. In practice an initial value of β is set ($=\beta_0$), which corresponds to the required threshold acceleration value below which α may vary but $\beta_0$ remains fixed. For an applied acceleration above this value, α is held constant and β is increased. Due to the squared voltage dependency of the forces, the polarity of $\beta$ may be either positive or negative with only a change in sign of the resultant force however only negative values of $\beta$ will be described hereafter for convenience. FIG. 5 shows the variation of $\beta$ (solid line) and $\alpha$ (broken line) versus applied acceleration for an exemplary device with a ±70 g dynamic range where the value of $\beta_0$ has been set to achieve a threshold acceleration value of ~|4.7| g. For a $V_{ref}$=30V this value of $\beta_0$ corresponds to a 1V voltage offset from $V_{ref}/2$ which gives $V_B$=14V.

In the conventional electronic control scheme of the prior art, shown in FIG. 1, the proof mass 103 is biased to 0V (i.e. $\beta$=0) which provides the maximum variation in feedback force as the mark:space ratio parameter, $\alpha$, is adjusted. This adjustment is limited to a values between 0.1 and 0.9, as described in U.S. Pat. No. 7,267,006, to allow sufficient time for the waveforms to stabilise prior to sampling.

Figure 6:
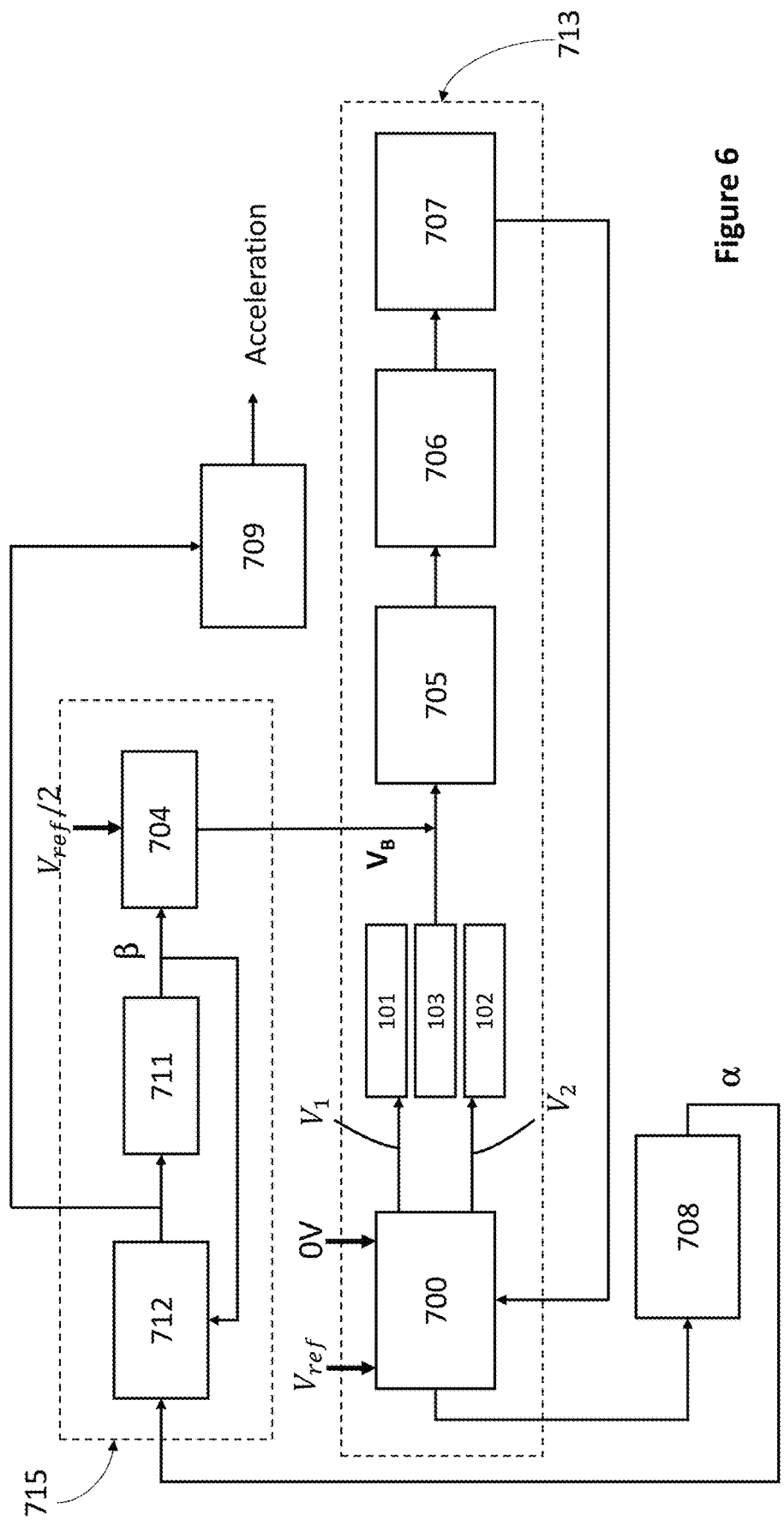
FIG. 6 illustrates a first embodiment of an electronic control scheme for a closed loop capacitive accelerometer according to the present disclosure.

FIG. 6 shows a schematic of a first implementation of an electronic control scheme according to an example of the present disclosure. The capacitive accelerometer has the same physical structure as seen in FIG. 1, comprising a proof mass 103 and first and second fixed capacitive electrodes 101, 102. Many of the functional blocks are the same as the device of U.S. Pat. No. 7,267,006, shown in FIG. 1, with blocks 700 and 705-709 performing equivalent functions as the respective blocks 100 and 105-109 of FIG. 1. A first closed loop circuit 713 is arranged to detect a signal resulting from displacement of the proof mass 103 and control the pulse width modulation signal generator 700 to apply the first and second drive signals $V_1$, $V_2$ with a variable mark:space ratio. Similarly to block 108 in FIG. 1, block 708 in FIG. 6 calculates the necessary mark:space ratio depending on the applied acceleration. The parameter $\alpha$ related to the mark:space ratio is output from the block 708 and input to a second closed loop circuit 715. The basic functionality of the electronic control scheme of FIG. 6 is similar to that shown in FIG. 1 when operating below the threshold acceleration value.

Figure 7:
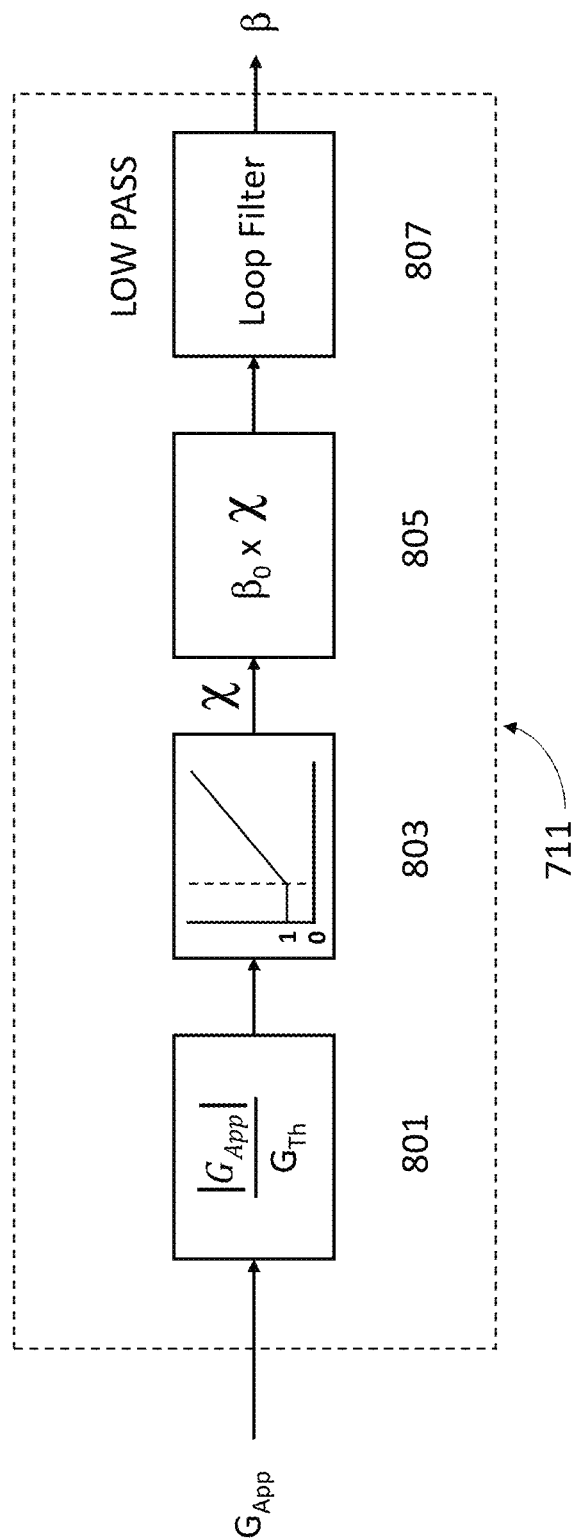
FIG. 7 illustrates a first embodiment of the Variable G Loop portion of an electronic control scheme for a closed loop capacitive accelerometer according to the present disclosure.

For operations above this threshold value, the electronic control scheme according to examples of the present disclosure additionally includes a variable g-range (VGR) loop 711 and a G calculation block 712 in the second closed loop circuit 715. The VGR loop 711 is used to determine the appropriate voltage offset value, represented by $\beta$, based on the applied acceleration level. The VGR loop operation for this implementation is shown in FIG. 7. The force feedback required to null the applied acceleration is defined in equation 5 above. The magnitude of this force is calculated by the G calculation block 712, using the values of $\alpha$ and $\beta$ which provides the input to the VGR loop 711. The output of the VGR loop 711 is a value of $\beta$ which is input to a DC biasing block 704 in the second closed loop circuit 715. The block 704 determines the magnitude, $V_B$, of the voltage to be applied to the proof mass 103 by applying the voltage offset represented by $\beta$. In practice, $\beta$ may be appropriately scaled in the block 704 to adjust the magnitude, $V_B$, of the voltage that is applied to the proof mass 103 with the voltage offset incorporated, e.g. as described in relation to FIG. 4.

As seen in FIG. 7, the modulus of the applied acceleration $G_{App}$ is divided by a pre-set threshold value, $G_{Th}$ in block 801. The resultant value is applied to the block 803 which produces an output, X, (shown on y axis) which sets the value equal to 1 for accelerations below the threshold value. The value of X increases linearly with applied acceleration (shown on x axis) above the threshold value, indicated by the dotted line. This means that the value of X is limited to values ≥1. The value of $\beta_0$, which sets the below threshold value of $V_B$, is multiplied by X in block 805 to produce an output which is then applied to a low pass filter 807 to provide the required dynamic response characteristics. Returning to FIG. 6, the modified output, $\beta$, is applied to the DC Biasing block 704 where it is scaled and subtracted from the reference voltage level $V_{ref}/2$ to produce $V_B$, prior to application to the input of the pre-amplifier 705. The output $\beta$ is also applied to the G calculation block 712, together with the $\alpha$ value, in a closed loop 715. The output of block 712 is also supplied to an output filter 709 which applies scaling and filtering to provide an acceleration output with the required dynamic response.

Figure 8:
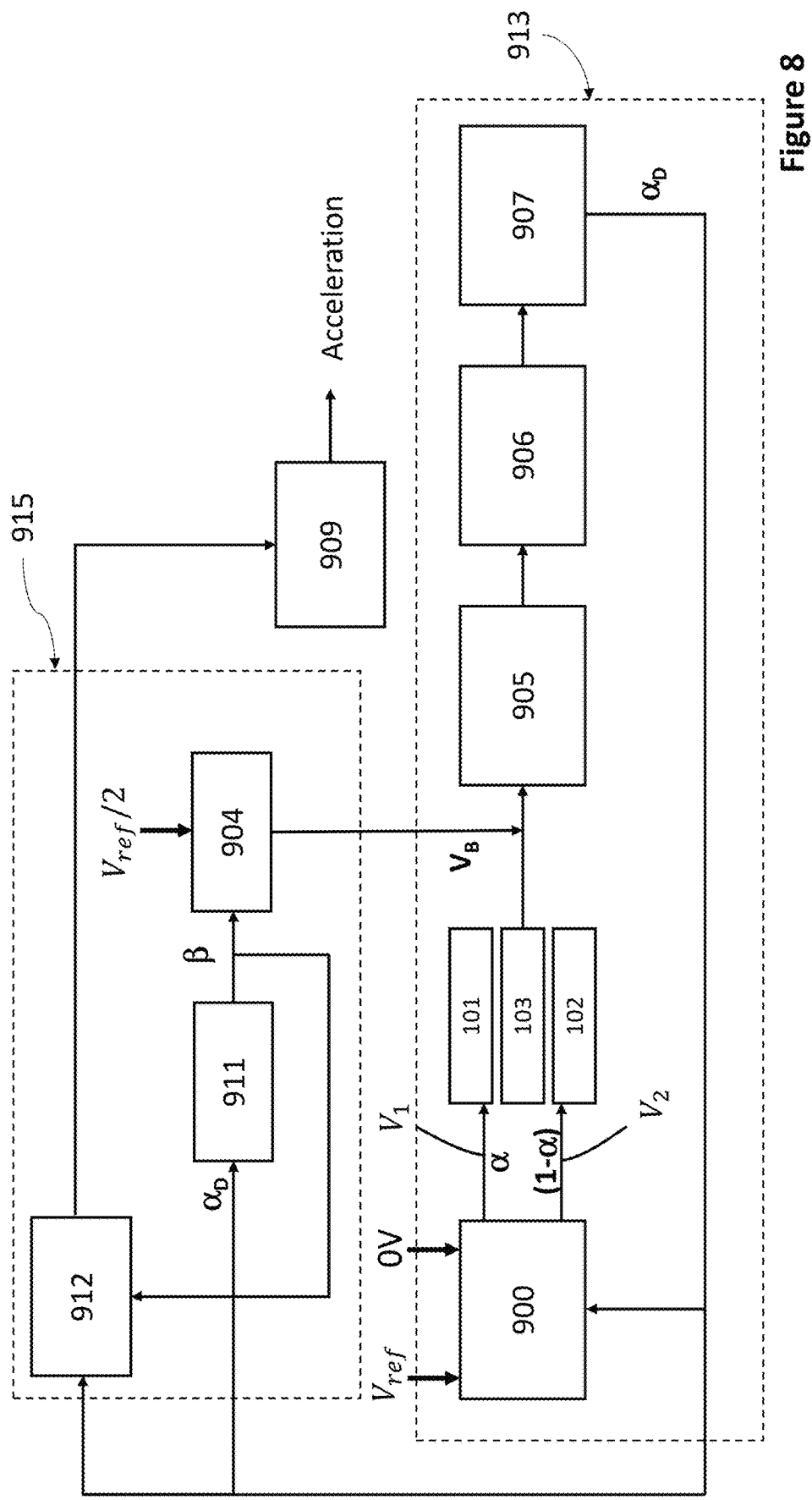
FIG. 8 illustrates a second embodiment of an electronic control scheme for a closed loop capacitive accelerometer according to the present disclosure.

FIG. 8 shows a schematic of an alternative implementation of an electronic control scheme according to an example of the present disclosure. The capacitive accelerometer has the same physical structure as seen in FIG. 1, comprising a proof mass 103 and first and second fixed capacitive electrodes 101, 102. Many of the functional blocks are the same as those of FIG. 6, with blocks 900 and 905-909 performing equivalent functions as the respective blocks 700 and 705-709 of FIG. 6. In this implementation it is the output of the loop filter 907, $\alpha_D$, which drives the PWM Signal Generator 900. The value of $\alpha_D$ is also applied directly to the VGR loop 911 and to the G Calculation block 912. The operation of the VGR loop 911 for this implementation is different to that described for the implementation shown in FIG. 7, and is shown in FIG. 9.

Figure 9:
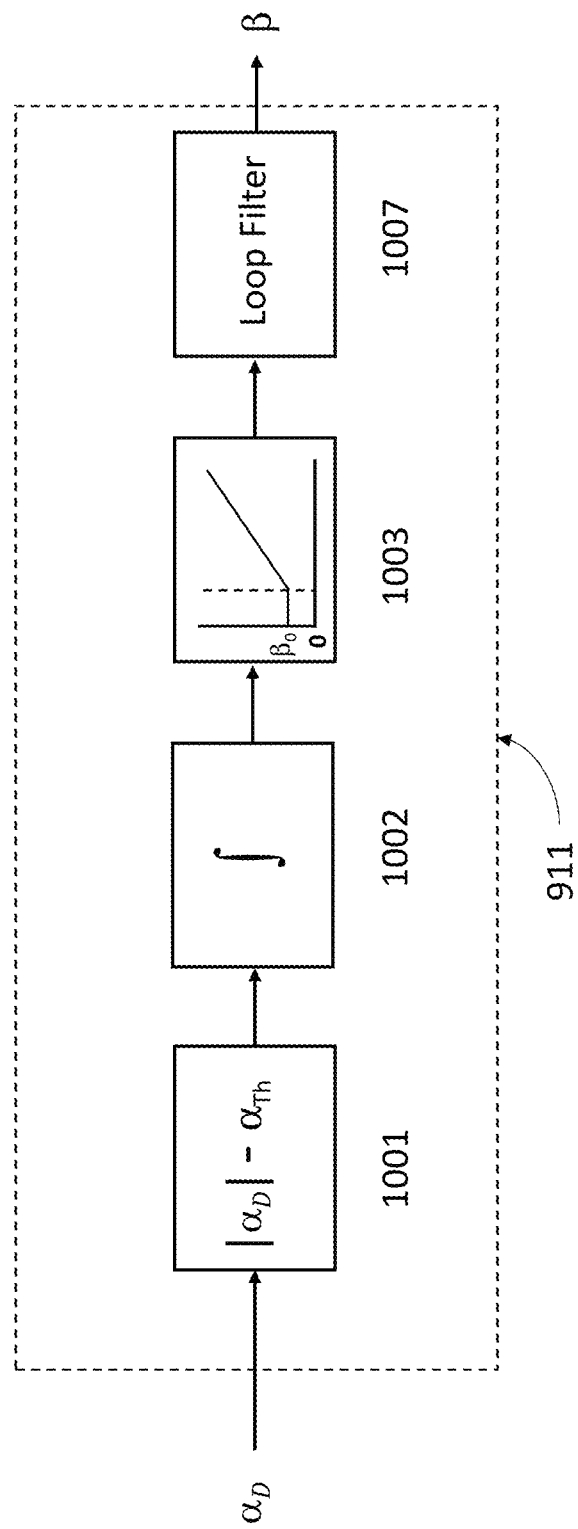
FIG. 9 illustrates a second embodiment of the Variable G Loop portion of an electronic control scheme for a closed loop capacitive accelerometer according to the present disclosure.

FIG. 9 shows the alternative VGR loop 911 in more detail. In this implementation, the output of the loop filter, $\alpha_D$, is applied directly to the VGR loop 911. This parameter $\alpha_D$ represents the mark/space ratio required so as to provide a net electrostatic restoring force on the proof mass for balancing the inertial force of the applied acceleration and maintaining the proof mass at a null position. The value of $\alpha_D$ varies between a positive and negative value where the maximum positive value sets the mark:space ratio at 0.9 and the maximum negative value sets the mark:space ratio to 0.1. With appropriate scaling, $\alpha_D$ can be considered to vary between ±0.4 with $\alpha_D$=0 giving a value of $\alpha$=0.5 (i.e. a 50:50 mark:space ratio). In the VGR loop 911, $\alpha_D$ is applied to block 1001 which subtracts $\alpha_{Th}$ (which may be set at 0.4) from the absolute value of $\alpha_D$. The output of block 1001 is an error signal which is positive when $|\alpha_D|$>0.4 and negative when $|\alpha_D|$<0.4. This output is applied to an integrator 1002 which accumulates the error over time. The output of this block 1002 is used to adjust the value of $\beta$ in block 1003. FIG. 9 shows in block 1003 the variation of $\beta$ (y axis) as a function of the absolute applied g level (x axis) with the dashed line indicating the threshold acceleration value (threshold g level). The value of $\beta$ increases for a positive error and decreases for a negative error with the limitation that $\beta \geq \beta_0$ at all times.

The operation of the VGR loop 911 may therefore be understood as follows. If the accelerometer is initially switched on in a stationary state (e.g. at zero g), where the applied acceleration is below the threshold value, then $\beta$ will be initially at $\beta_0$ with $\alpha_D$=0. For any applied acceleration below the threshold level the value of $\alpha_D$ applied to the VGR loop 911 will be <±0.4 and therefore the output of block 1001 will be a negative value which, when integrated, drives a reduction in the value of $\beta$. However, the limitation that $\beta \geq \beta_0$, applied in block 1003, means that $V_B$ is unchanged from its initial value. When the applied acceleration exceeds the threshold value, the value of $|\alpha_D|$ may briefly exceed 0.4 and the output of block 1002 becomes positive. The value of $\beta$ is then increased in block 1003 until the input error is driven back to zero, at which point $|\alpha_D|$ returns to its limiting value of 0.4. Any further increase in the applied acceleration will result in a further increase in β, with $|\alpha_D|$ remaining constant. Similarly, if the applied acceleration is subsequently reduced, the instantaneous value of $|\alpha_D|$ will be <0.4 and the output of block 1002 will drive a reduction of β.

The extent to which the value of $|\alpha_D|$ may transiently deviate from the 0.4 limit above the threshold acceleration value, during rapid acceleration or deceleration events, will depend on the dynamic response of the VGR control loop 911. This is primarily determined by the loop filter parameters in 1007. In practice, it is desirable to limit the variation in $\alpha_D$ above the threshold acceleration value to <±5% to ensure that $V_1$ and $V_2$ are not switching close to sampling points.

Returning to FIG. 8, the values of $\alpha_D$ and β are applied to the G Calculation block 912 in a closed loop 915. This operates similarly to block 712 in FIG. 6 with the exception that a is now replaced by ($\alpha_D$+0.5). The G calculation block 912 calculates an output which is scaled and filtered by the Output Filter 909 to provide an acceleration output with the required dynamic response.

The absolute threshold acceleration value (i.e. when α=0.1 or 0.9) is determined by the value of $β_0$. For the prior art device described above, with $V_{ref}$=30V and the proof mass bias, $V_B$, set to 0V, these limiting values of α result in an acceleration range of ±70 g. If the proof mass is biased, for example, to $V_B$=13.5V ($β_0$=0.1) then the range is reduced to ~±7 g. The preferred threshold acceleration value may therefore be selected according to the requirements of the device application. In a typical IMU application the acceleration levels are likely to be ≤±1 g for significant periods of time, with the platform on which it is mounted being static or being subjected to relatively limited maneuvering for the majority of the time. In this instance, it would be possible to set the threshold to close to |1| g, for example at 11.51 g, which would correspond to a $V_B$ of ~14.68V ($β_0$=0.021), thus minimising the detrimental effects on bias at 0 g.

There is however an additional consideration which is the variation in the $\overline{V_A}$ voltages as a function of α. For increasing applied acceleration levels up to the threshold value, α approaches the limiting value (0.1 or 0.9) and $\overline{V_A}$ will reach a maximum which increases the charge migration effect. For a device with a threshold limit set at ±7 g, a 1 g applied acceleration would result in $\overline{V_{A1}}$ and $\overline{V_{A2}}$ values of −0.214V and 3.214V respectively, which are low compared to the prior art device shown in FIG. 1 and will exhibit significantly reduced levels of charge migration. If the threshold is reduced to ±1.5 g, the 0 g offsets will be very low at 0.32V, however for a 1 g applied acceleration the $\overline{V_{A1}}$ and $\overline{V_{A2}}$ values will increase to −7.78V and 7.82V, respectively. Therefore, it is desirable to set the threshold value at a higher level to limit $V_A$ for the periods when the IMU is stationary. Conveniently the threshold value is set such that the $\overline{V_{A1}}$ and $\overline{V_{A2}}$ voltages are constrained within a range of <±5V for applied accelerations in the range ±1.5 g.

Figure 10A:
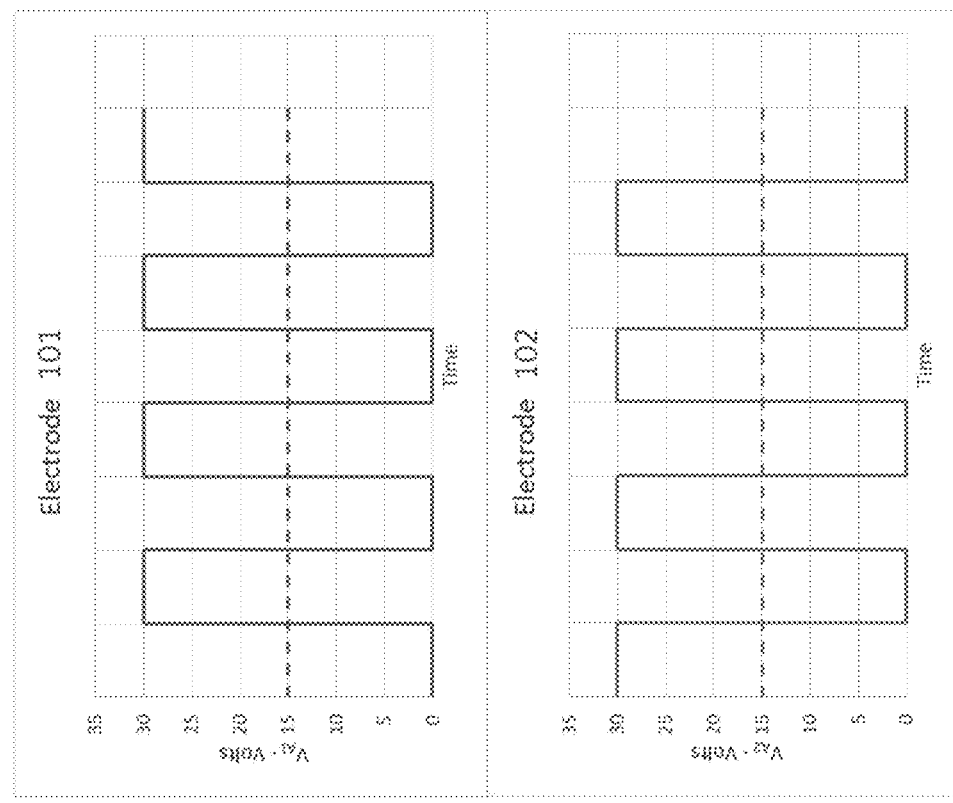
FIGS. 10a and 10b show a comparison of the applied voltage waveforms for electrodes 1 and 2, for a 50:50 mark:space ratio under a zero applied acceleration condition, according to examples of the present disclosure and the prior art.
Figure 10B:
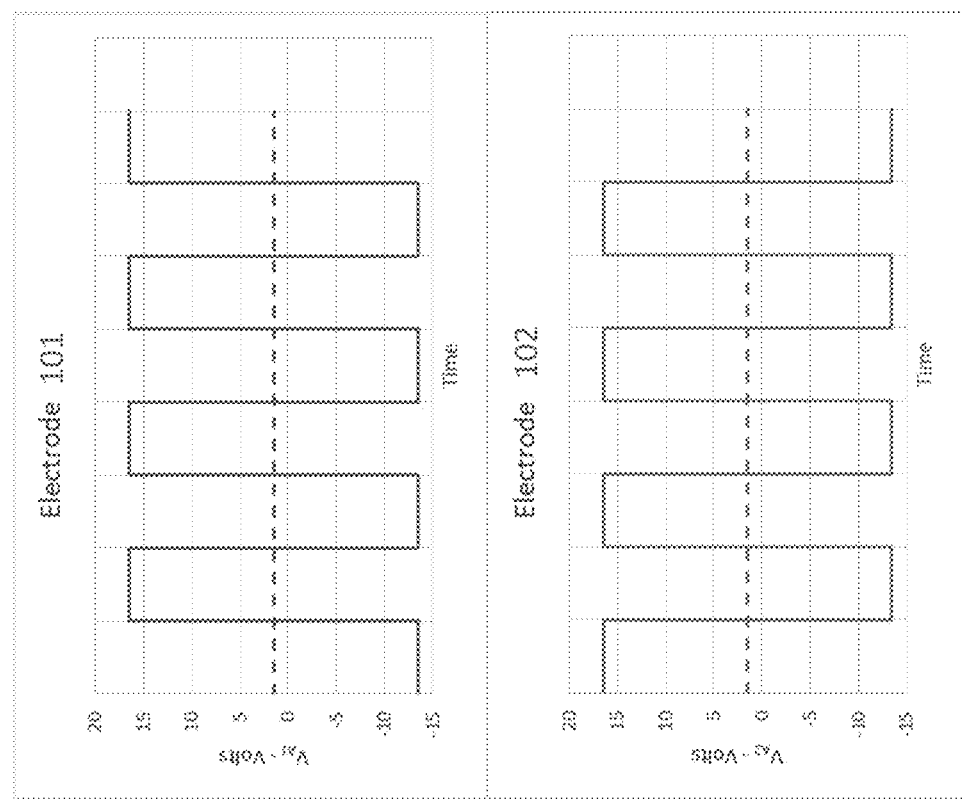

FIGS. 10a and 10b compare the periodic waveforms of the differential voltages $\overline{V_{A1}}$ and $\overline{V_{A2}}$, between the electrodes 101, 102 and the proof mass 103, for a 0 g applied acceleration, for a device according to the present disclosure (FIG. 10a) and the prior art device of U.S. Pat. No. 7,267,006 (FIG. 10b) and. At zero acceleration, the α value is 0.5 and it can be seen that for a device according to the present disclosure, the mean voltages, $V_{A1}$ and $V_{A2}$, are therefore close to zero (1.5V) in FIG. 10a, which is an order of magnitude below those for the prior art device in FIG. 10b.

FIGS. 11a and 11b compare the electrostatic forces generated by each electrode 101, 102, for a 0 g applied acceleration, for a device according to the present disclosure (FIG. 11a) and the prior art device of U.S. Pat. No. 7,267,006 (FIG. 11b). It can be seen that the mean forces generated by each fixed electrode 101, 102 in a device according to the present disclosure (FIG. 11a) are also reduced by a factor of around two compared to the prior art device (FIG. 11b).

Figure 12:
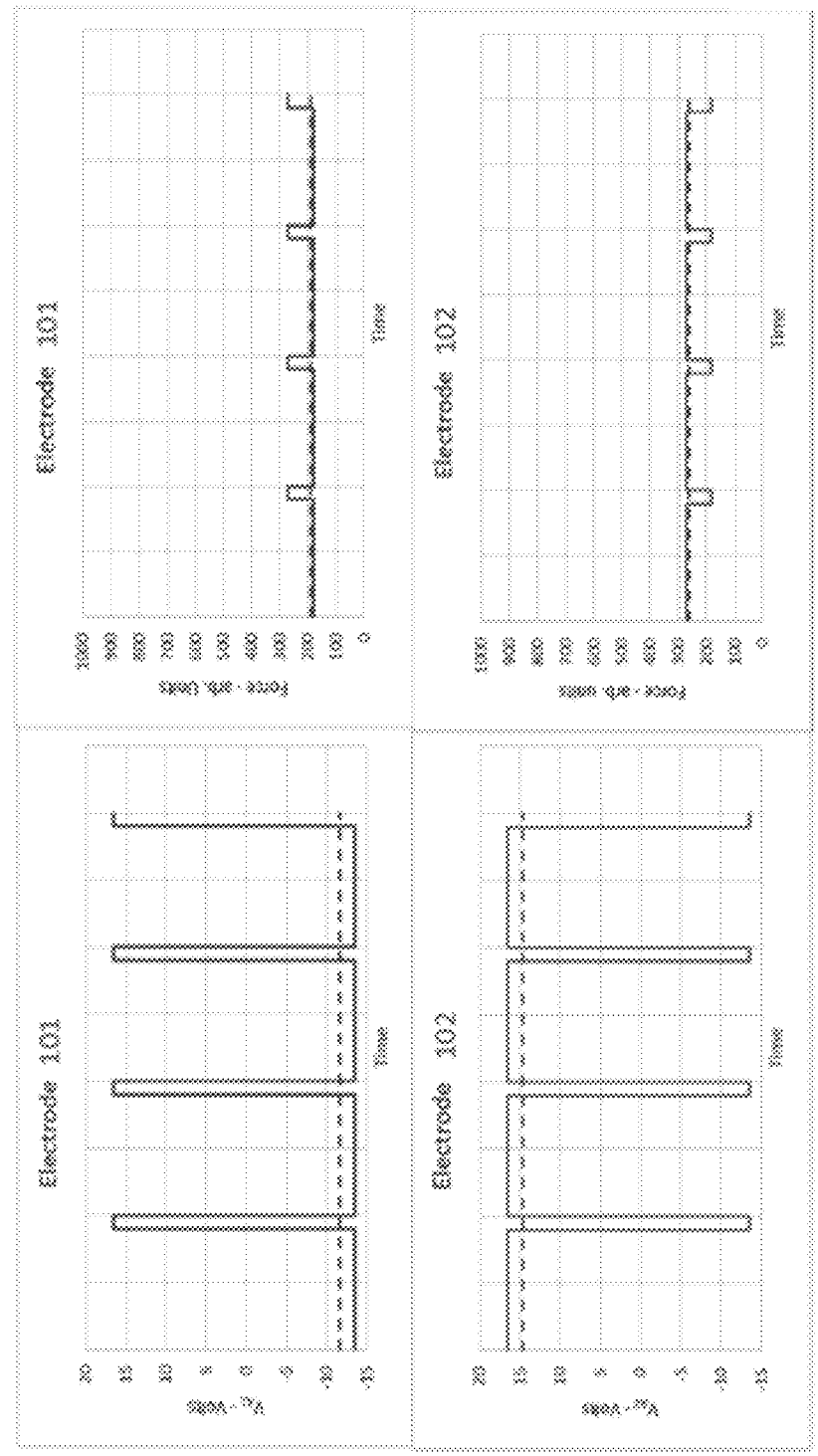
FIG. 12 shows the applied voltage waveforms and resultant electrostatic forces for electrodes 1 and 2, for a 10:90 mark:space ratio under a 7 g applied acceleration condition, according to examples of the present disclosure.

FIG. 12 shows the corresponding voltage and force waveforms at the positive acceleration threshold value of 7 g (α=0.1) for a device according to the present disclosure. The mean differential voltages $\overline{V_{A1}}$ and $\overline{V_{A2}}$ are −11.625V and 14.625V, respectively. This compares with the equivalent prior art device values at ±7 g of 13.8V and 16.2V (α=0.46). These voltages offsets do become larger as the g level increases however the mean opposing forces are still significantly lower than the equivalent prior art device.

Figure 13:
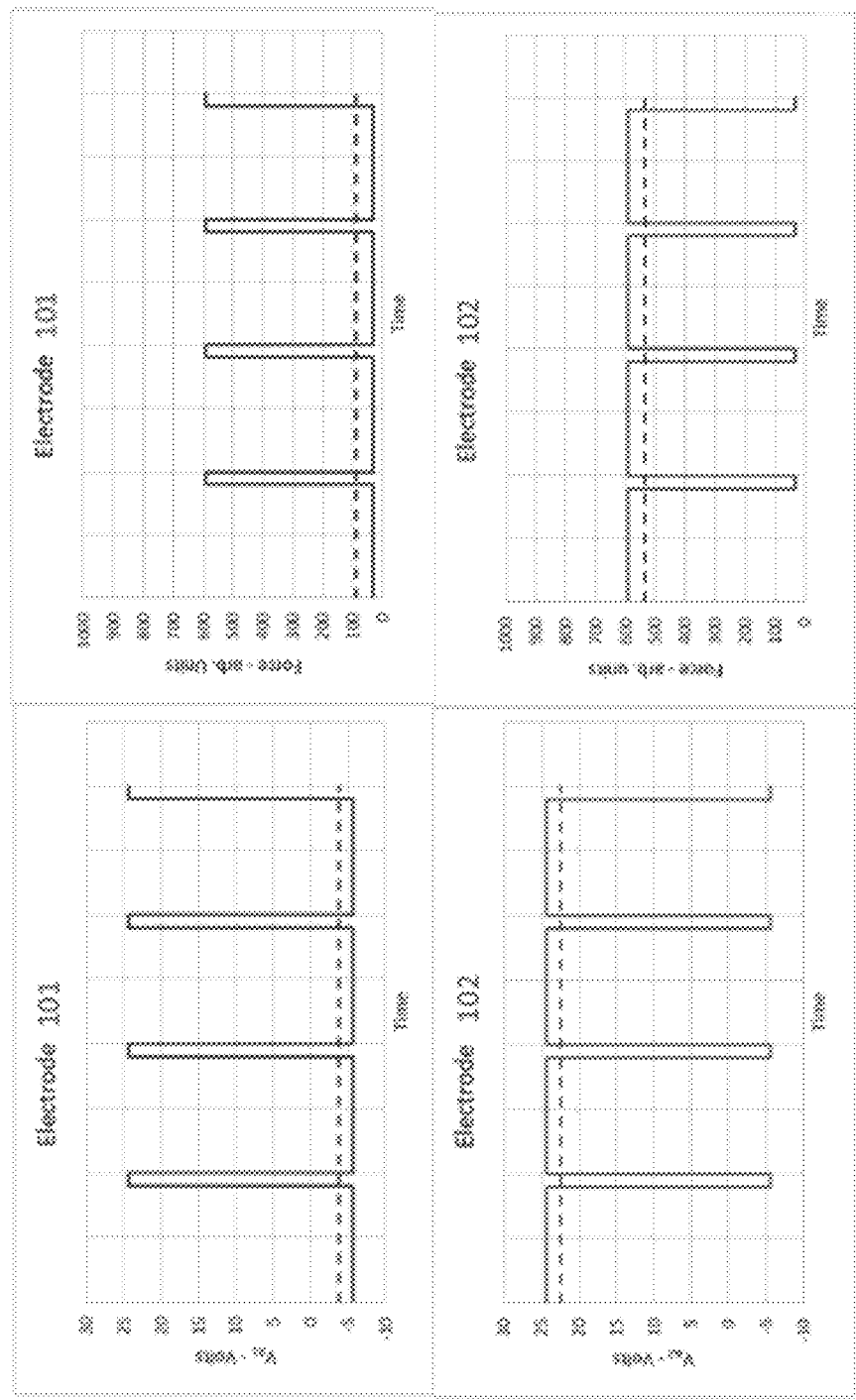
FIG. 13 shows the applied voltage waveforms and resultant electrostatic forces for electrodes 1 and 2, for a 10:90 mark:space ratio under a 44 g applied acceleration condition, according to examples of the present disclosure.
Figure 14:
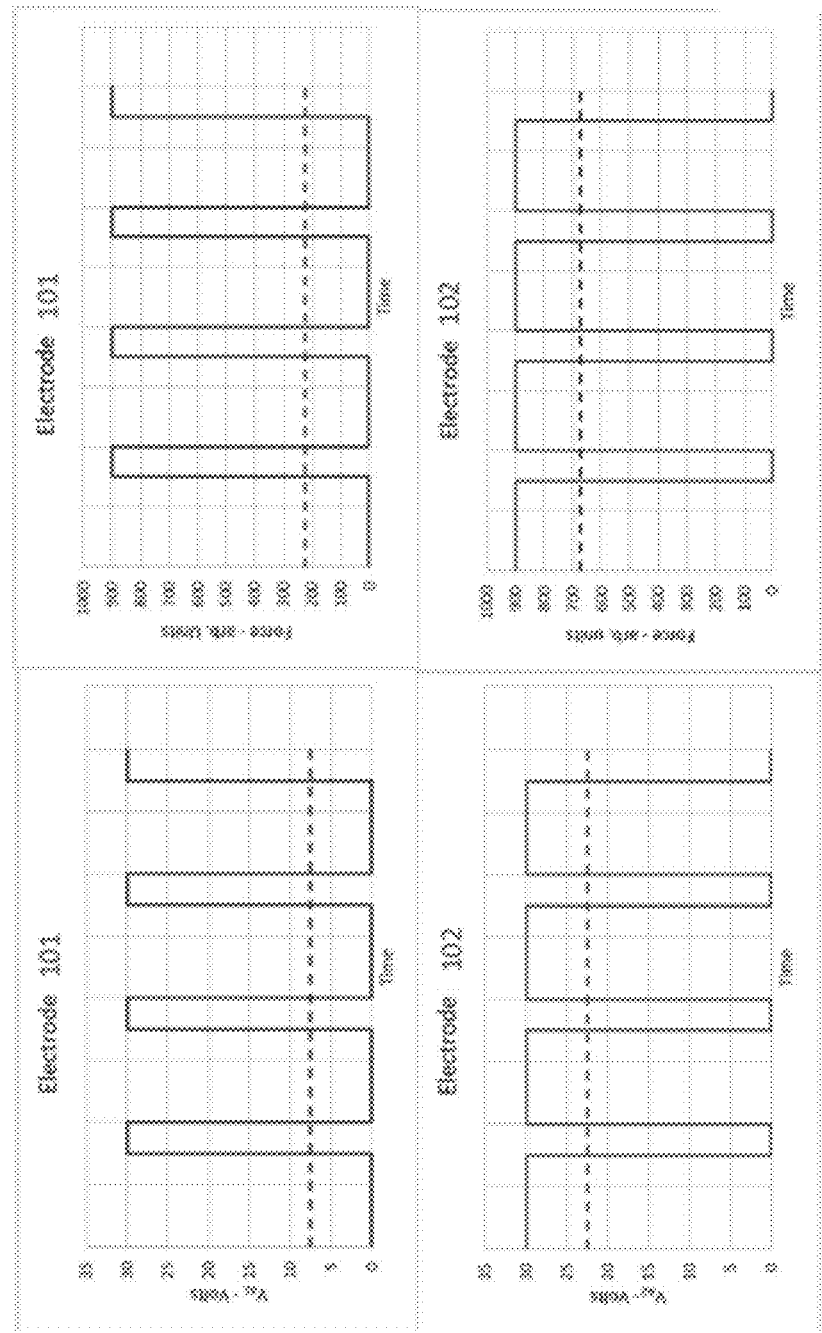
FIG. 14 shows the applied voltage waveforms and resultant electrostatic forces for electrodes 1 and 2, for a 25:75 mark:space ratio under a 44 g applied acceleration condition, according to the prior art.

FIG. 13 shows the voltage and force waveforms for a 44 g input, which is above the threshold g level, for a device according to the present disclosure. The value of a remains fixed at 0.1 with $V_B$=5.645V. The equivalent plots for the prior art are shown in FIG. 14.

The control electronics for the device of U.S. Pat. No. 7,267,006 have been produced in an ASIC form. This provides the majority of the functionality required to implement closed loop operation according to examples of the present disclosure, with the exception of the circuitry required for the DC biasing function. The VGR block 711, 911 and G Calculation block 712, 912 functions may be implemented digitally in the control software within the ASIC. The value of β may similarly be calculated and applied to a discrete, external Digital to Analogue Convertor to provide a voltage which is offset with respect to $V_{ref}$, using external circuitry, to produce $V_B$ which is then used to bias the pre-amplifier input.

The proof mass 103 and fixed capacitive electrodes 101, 102 may have any suitable arrangement in a capacitive accelerometer as generally disclosed herein. For example, the proof mass may be moveable in a pendulous or hinged structure. EP0338688 provides an applicable example of a moveable proof mass electrode formed at the tip of a silicon cantilever and fixed electrodes arranged to oppose the moveable electrode. However, in some preferred examples the proof mass is planar and comprises moveable electrodes fingers that interdigitate with fixed electrode fingers extending from the first and second fixed capacitive electrodes. Such an interdigitated or comb-like electrode structure is well-known in the art, for example as disclosed in any of U.S. Pat. Nos. 6,761,069, 6,631,643, or U.S. Pat. No. 7,267,006, the contents of each of which are hereby incorporated by reference.

Figure 15:
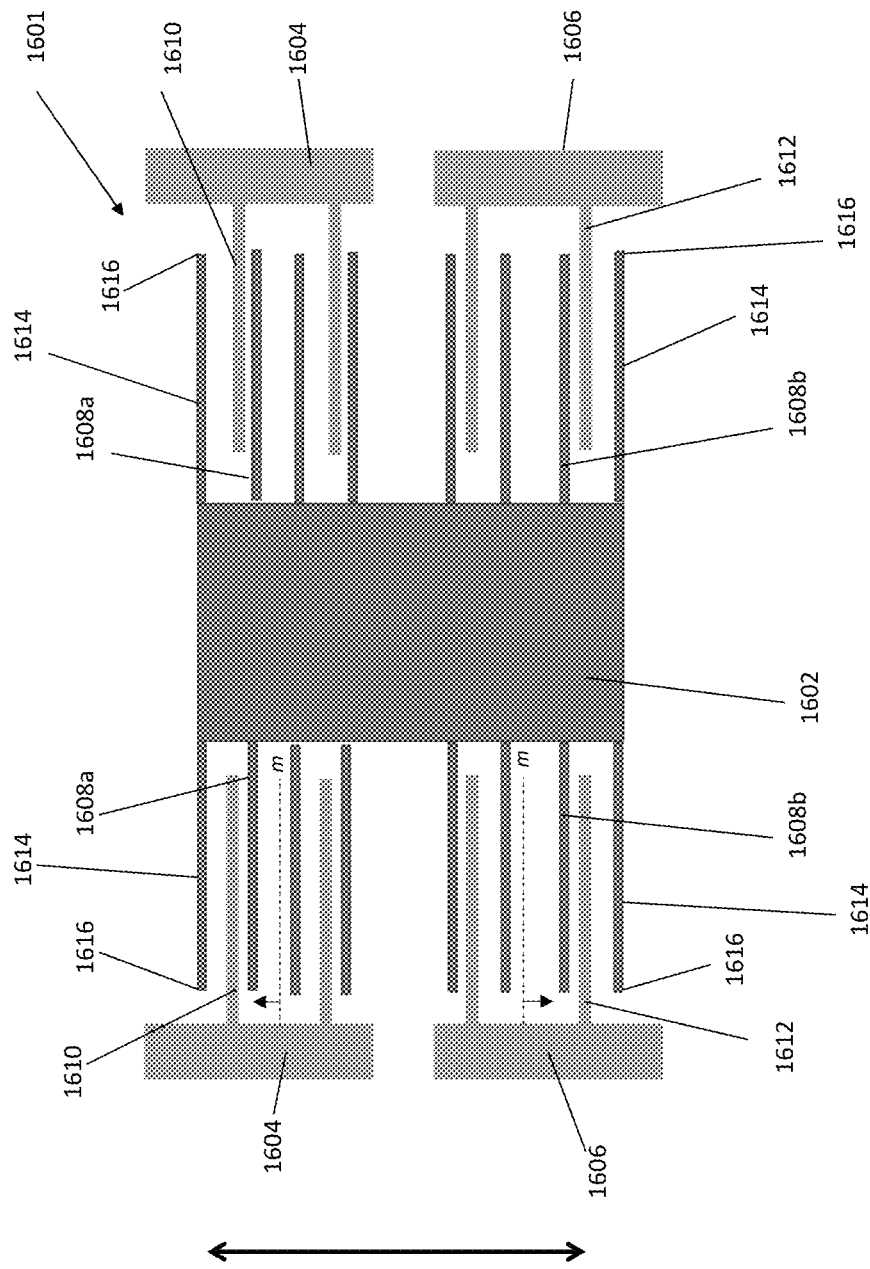
FIG. 15 is a schematic representation of an exemplary electrode arrangement in a capacitive accelerometer.

An exemplary electrode structure for a capacitive accelerometer 1601 is schematically illustrated in FIG. 15, which is similar to that described in U.S. Pat. No. 7,267,006. In this example, the proof mass 1602 is substantially planar and mounted to a fixed substrate (not seen) by flexible support legs 1614 so as to be linearly moveable in a plane along the sensing axis (as indicated by the double-headed arrow) in response to an applied acceleration. The flexible support legs 1614 extend from the body of the proof mass 1602 and are fixed at anchor points 1616 to the fixed substrate.

First and second fixed capacitive electrodes 1604, 1606 are formed in the fixed substrate in the same plane. The proof mass 1602 comprises first and second sets of moveable capacitive electrode fingers 1608 extending from the proof mass 1602, substantially perpendicular to the sensing axis and spaced apart along the sensing axis. It may also be seen that the first and second fixed capacitive electrodes 1604, 1606 comprise, respectively, first and second sets of fixed capacitive electrode fingers 1610, 1612 extending substantially perpendicular to the sensing axis and spaced apart along the sensing axis. The first set of fixed capacitive electrode fingers 1610 is arranged to interdigitate with the first set of moveable capacitive electrode fingers 1608a with a first offset in one direction along the sensing axis from a median line m between adjacent fixed capacitive electrode fingers 1610, and the second set of fixed capacitive electrode fingers 1612 is arranged to interdigitate with the second set of moveable capacitive electrode fingers 1608b with a second offset in the opposite direction along the sensing axis from a median line m between adjacent fixed capacitive electrode fingers 1612.

The proof mass 1602 can move in-plane relative to the fixed electrodes 1604, 1606 in a direction along the sensing axis in response to an applied acceleration. As the two sets of fixed electrode fingers 1610, 1612 are offset from the proof mass fingers 1608a, 1608b in opposite directions, a movement in either direction can be measured. These offsets may be equal in size. The difference in offset for the first set of fixed electrode fingers 1610 and the second set of fixed electrode fingers 1612 relative to the moveable fingers 1608a, 1608b causes an attractive force when a drive signal (e.g. voltage waveform) is applied to the first and second sets of fixed electrode fingers 1610, 1612.

In open loop operation, movement of the proof mass 1602 in response to an applied acceleration causes a change in the offset between the proof mass fingers 1608a, 1608b and the fixed electrode fingers 1610, 1612. This change can be used to calculate the acceleration, as it will cause a change in differential capacitance. In closed loop operation, the interdigitated electrode fingers do not actually move relative to one another. Applying pulse width modulation (PWM) to the first and second drive signals applied to the first and second fixed capacitive electrodes 1604, 1606, an electrostatic restoring force acts on the proof mass fingers 1608a, 1608b so that under acceleration the proof mass 1602 does not move from the null position seen in FIG. 16, with the inertial force of the applied acceleration being balanced by a net electrostatic restoring force.

It will be appreciated by those skilled in the art that the disclosure has been illustrated by describing one or more specific examples thereof, but is not limited to these aspects; many variations and modifications are possible, within the scope of the accompanying claims.

The invention claimed is:

1. A method for closed loop operation of a capacitive accelerometer, the capacitive accelerometer comprising:
a proof mass moveable along a sensing axis in response to an applied acceleration; and
first and second fixed capacitive electrodes arranged symmetrically either side of the proof mass along the sensing axis with a gap defined between each of the first and second fixed capacitive electrodes and the proof mass under zero applied acceleration; the method comprising:
applying a DC voltage of magnitude $V_B$ to the proof mass based on a threshold acceleration value;
applying a first drive signal $V_1$ to the first fixed capacitive electrode, a second drive signal $V_2$ to the second fixed capacitive electrode, the first and second drive signals each having a periodic waveform varying in amplitude between zero and a maximum value;
sensing a displacement of the proof mass in response to an applied acceleration;
determining whether the applied acceleration is greater than the threshold acceleration value;
in response to determining that the applied acceleration is not greater than the threshold acceleration value, applying pulse width modulation to the first and second drive signals $V_1$, $V_2$ with a variable mark/space ratio so as to provide a net electrostatic restoring force on the proof mass for balancing the inertial force of the applied acceleration and maintaining the proof mass at a null position; and
in response to determining that the applied acceleration is greater than the threshold acceleration value, applying pulse width modulation to the first and second drive signals $V_1$, $V_2$ with a constant mark/space ratio, and changing the magnitude, $V_B$, of the DC voltage applied to the proof mass so as to provide a net electrostatic restoring force on the proof mass for balancing the inertial force of the applied acceleration and maintaining the proof mass at a null position.

2. The method of claim 1, wherein the magnitude, $V_B$, of the DC voltage applied to the proof mass for applied acceleration values below the threshold acceleration value is chosen to be approximately half of the maximum value of the amplitude of the first and second drive signals $V_1$, $V_2$.

3. The method of claim 1, wherein changing the magnitude $V_B$ of the DC voltage applied to the proof mass comprises: applying a voltage offset, represented by $\beta$, wherein $\beta=\beta_0$ is constant for an applied acceleration below the threshold acceleration value and wherein $\beta$ increases linearly with applied acceleration for an applied acceleration above the threshold acceleration value.

4. The method of claim 3, wherein $\beta$ increases linearly with applied acceleration up to a maximum of ±1 corresponding to setting the magnitude $V_B$ equal to zero or the maximum value of the amplitude of the first and second drive signals $V_1$, $V_2$.

5. The method of claim 3, wherein $\beta$ is determined by:
determining the applied acceleration;
calculating a ratio of the applied acceleration and the threshold acceleration value to define a scale factor X that increases linearly with the applied acceleration above the threshold acceleration value; and
applying the scale factor X to the constant $\beta_0$ to give a resultant value for $\beta$.

6. The method of claim 5, wherein the value of the scale factor X is limited to values ≥1.

7. The method of claim 3, wherein $\beta$ is determined by:
determining a parameter $\alpha_D$ related to the mark/space ratio;
subtracting a threshold value $\alpha_{Th}$ from the absolute value of $\alpha_D$;
above the threshold acceleration value, increasing or decreasing the value of $\beta$ to zero the value of $|\alpha_D|-\alpha_{Th}$.

8. The method of claim 1, wherein the threshold acceleration value is selected to have a magnitude between 1 g and 5 g, and preferably a magnitude of about 1.5 g.

9. The method of claim 1, further comprising:
outputting a signal indicative of the applied acceleration.

10. The method of claim 1, wherein the capacitive accelerometer comprises a silicon MEMS structure and/or wherein the proof mass is substantially planar.

11. The method of claim 1, wherein the proof mass is mounted to a fixed substrate by flexible support legs so as to be linearly moveable in a plane along the sensing axis in response to an applied acceleration, and wherein the first and second fixed capacitive electrodes are formed in the fixed substrate in the same plane.

12. The method of claim 1, wherein:
the proof mass comprises first and second sets of moveable capacitive electrode fingers extending from the proof mass, substantially perpendicular to the sensing axis and spaced apart along the sensing axis; and
the first and second fixed capacitive electrodes comprise, respectively, first and second sets of fixed capacitive electrode fingers extending substantially perpendicular to the sensing axis and spaced apart along the sensing axis; and
the first set of fixed capacitive electrode fingers is arranged to interdigitate with the first set of moveable capacitive electrode fingers with a first offset in one direction along the sensing axis from a median line between adjacent fixed capacitive electrode fingers, and the second set of fixed capacitive electrode fingers is arranged to interdigitate with the second set of moveable capacitive electrode fingers with a second offset in the opposite direction along the sensing axis from a median line between adjacent fixed capacitive electrode fingers.

13. A capacitive accelerometer comprising:
a proof mass moveable along a sensing axis in response to an applied acceleration;
first and second fixed capacitive electrodes arranged symmetrically either side of the proof mass along the sensing axis with a gap defined between each of the first and second fixed capacitive electrodes and the proof mass under zero applied acceleration;
a DC biasing element arranged to apply a DC voltage of magnitude $V_B$ to the proof mass based on a threshold acceleration value;
a pulse width modulation signal generator arranged to apply a first drive signal $V_1$ to the first fixed capacitive electrode and a second drive signal $V_2$ to the second fixed capacitive electrode, the first and second drive signals each having a periodic waveform varying in amplitude between zero and a maximum value;
a first closed loop circuit arranged to detect a signal resulting from displacement of the proof mass and control the pulse width modulation signal generator to apply the first and second drive signals $V_1$, $V_2$ with a variable mark:space ratio so as to provide a net electrostatic restoring force on the proof mass for balancing the inertial force of the applied acceleration and maintaining the proof mass at a null position, when the applied acceleration is not greater than a threshold acceleration value; and
a second closed loop circuit arranged to keep the mark: space ratio constant and to change the magnitude, $V_B$, of the DC voltage applied to the proof mass by the DC biasing element so as to provide a net electrostatic restoring force on the proof mass for balancing the inertial force of the applied acceleration and maintaining the proof mass at a null position, when the applied acceleration is greater than a threshold acceleration value.

14. The capacitive accelerometer of claim 13, wherein the second closed loop circuit is arranged to change the magnitude $V_B$ of the DC voltage applied to the proof mass by applying a voltage offset, represented by $\beta$, wherein $\beta=\beta_0$ is constant for an applied acceleration below the threshold acceleration value and wherein $\beta$ increases linearly with applied acceleration for an applied acceleration above the threshold acceleration value.

15. The capacitive accelerometer of claim 13, comprising a silicon MEMS structure; and
wherein the proof mass is mounted to a fixed substrate by flexible support legs so as to be linearly moveable in a plane along the sensing axis in response to an applied acceleration, and wherein the first and second fixed capacitive electrodes are formed in the fixed substrate in the same plane; or
wherein the proof mass is substantially planar; or
wherein the proof mass comprises first and second sets of moveable capacitive electrode fingers extending from the proof mass, substantially perpendicular to the sensing axis and spaced apart along the sensing axis; and
wherein the first and second fixed capacitive electrodes comprise, respectively, first and second sets of fixed capacitive electrode fingers extending substantially perpendicular to the sensing axis and spaced apart along the sensing axis; and
wherein the first set of fixed capacitive electrode fingers is arranged to interdigitate with the first set of moveable capacitive electrode fingers with a first offset in one direction along the sensing axis from a median line between adjacent fixed capacitive electrode fingers, and the second set of fixed capacitive electrode fingers is arranged to interdigitate with the second set of moveable capacitive electrode fingers with a second offset in the opposite direction along the sensing axis from a median line between adjacent fixed capacitive electrode fingers.

* * * * *